United States Patent
Zhu et al.

(10) Patent No.: US 10,479,937 B2
(45) Date of Patent: Nov. 19, 2019

(54) NARROW BAND RED PHOSPHOR

(71) Applicant: Intematix Corporation, Fremont, CA (US)

(72) Inventors: Haoguo Zhu, Fremont, CA (US); Yi-Qun Li, Danville, CA (US)

(73) Assignee: Intematix Corporation, Fremont, CA (US)

( * ) Notice: Subject to any disclaimer, the term of this patent is extended or adjusted under 35 U.S.C. 154(b) by 100 days.

(21) Appl. No.: 15/282,551

(22) Filed: Sep. 30, 2016

(65) Prior Publication Data

US 2017/0145309 A1 May 25, 2017

Related U.S. Application Data

(60) Provisional application No. 62/284,810, filed on Oct. 9, 2015.

(51) Int. Cl.

| | |
|---|---|
| *C09K 11/88* | (2006.01) |
| *C09K 11/02* | (2006.01) |
| *F21V 8/00* | (2006.01) |
| *G02F 1/1335* | (2006.01) |
| *H01L 25/075* | (2006.01) |
| *H01L 33/32* | (2010.01) |
| *H01L 33/48* | (2010.01) |
| *H01L 33/50* | (2010.01) |
| *H01L 33/56* | (2010.01) |
| *H01L 33/60* | (2010.01) |
| *H01L 33/62* | (2010.01) |
| *H01L 33/64* | (2010.01) |

(52) U.S. Cl.
CPC .......... *C09K 11/885* (2013.01); *C09K 11/025* (2013.01); *C09K 11/88* (2013.01); *G02B 6/005* (2013.01); *G02F 1/133514* (2013.01); *G02F 1/133603* (2013.01); *H01L 25/0753* (2013.01); *H01L 33/32* (2013.01); *H01L 33/486* (2013.01); *H01L 33/504* (2013.01); *H01L 33/56* (2013.01); *H01L 33/60* (2013.01); *H01L 33/62* (2013.01); *H01L 33/641* (2013.01); *G02F 2001/133614* (2013.01); *H01L 2224/48091* (2013.01); *H01L 2224/48247* (2013.01); *H01L 2224/49107* (2013.01); *H01L 2224/73265* (2013.01); *Y02B 20/181* (2013.01)

(58) Field of Classification Search
CPC .. C09K 11/885; C09K 11/7731; C09K 11/025
See application file for complete search history.

(56) References Cited

U.S. PATENT DOCUMENTS

| | | | |
|---|---|---|---|
| 7,112,921 B2 * | 9/2006 | Menkara | C09K 11/885 252/301.6 S |
| 8,098,005 B2 | 1/2012 | Kwak et al. | |
| 8,951,441 B2 | 2/2015 | Li et al. | |
| 2006/0082288 A1 * | 4/2006 | Menkara | C09K 11/7718 313/503 |
| 2013/0063926 A1 | 3/2013 | Winkler et al. | |
| 2014/0246693 A1 | 9/2014 | He et al. | |
| 2014/0361681 A1 | 12/2014 | Tao et al. | |

FOREIGN PATENT DOCUMENTS

| | | |
|---|---|---|
| KR | 20070002385 A | 1/2007 |
| WO | 2010134711 A2 | 11/2010 |
| WO | WO 2014/128676 * | 8/2014 |

OTHER PUBLICATIONS

Derwent abstract 1972-72567T, 1972, no month.*
International Search Report and Written Opinion dated Dec. 13, 2016 for PCT/US2016/055193.
Nazarov et al., "High Efficient LED for White Light," Moldavian Journal of the Physical Sciences, vol. 4, No. 4, 2005, pp. 485-495.
EPO Search Report for EP 16854142, dated Apr. 4, 2019.

* cited by examiner

*Primary Examiner* — C Melissa Koslow

(57) ABSTRACT

A narrow band red phosphor may have a general composition $MS_xSe_yA_z:Eu$, wherein M is at least one of Mg, Ca, Sr and Ba, A is at least one of C, N, B, P and a monovalent combining group NCN (cyanamide), and may in some embodiments further include one or more of O, F, Cl, Br and I. In embodiments $0.8 < x+y < 1.25$ and $0 < z \leq 0.05$, and in some embodiments x, y and z are determined strictly by charge balancing. A white light emitting device may comprise: a blue and/or UV excitation source; a narrow band red phosphor of the present invention; and phosphors with peak emission at shorter wavelengths, such as yellow, green, yellow/green and/or blue.

30 Claims, 18 Drawing Sheets

SECTION A-A

NARROW BAND RED PHOSPHOR

CROSS-REFERENCE TO RELATED APPLICATIONS

This application claims the benefit of U.S. Provisional Application No. 62/284,810 filed Oct. 9, 2015, incorporated in its entirety herein.

FIELD OF THE INVENTION

Embodiments of the present invention are directed to narrow band red phosphors with general composition $MS_x\text{-}Se_yA_z$:Eu, where M is at least one of Mg, Ca, Sr and Ba, and A is at least one of C, N, B, P, and a monovalent combining group NCN (cyanamide), and white light emitting devices including the same.

BACKGROUND OF THE INVENTION

Warm white LEDs with high-color-rendering index (CRI, Ra>80) and low correlated color temperature (CCT<4500K) need a suitable red phosphor. Successful phosphor materials include materials such as $Eu^{2+}$ or $Ce^{3+}$ doped (oxy)nitride compounds, for example $(Ba,Sr)_2Si_5N_8$:$Eu^{2+}$ and $(Ca,Sr)AlSiN_3$:$Eu^{2+}$. However, these phosphors have drawbacks when used in certain applications since their emission spectra are broad (full-width at half maximum is approximately 75-85 nm) and a large part of the spectrum is beyond 650 nm in wavelength—a part of the spectrum to which human eyes are insensitive—which significantly reduces the lumen efficacy of LED lighting. $MS_xSe_y$:$Eu^{2+}$ materials show red color emission from 600 to 650 nm, and provide high lumen efficacy of LED lighting after combining with yellow or green phosphors. However, the narrow band red phosphors with general composition $MS_xSe_y$:Eu are hygroscopic, and exhibit rapid deterioration of photoluminescence due to exposure to moisture (water vapor), oxygen and/or heat. Clearly there is a need for improved narrow band red phosphors with general composition $MS_xSe_y$:Eu, which are compatible with coatings to protect the phosphor particles from moisture and oxygen and enable a commercially useful phosphor.

Furthermore, there is a need for red narrowband phosphors at very specific wavelengths for use in LED backlights, increasing the display color gamut, and providing more vivid colors for TV, smartphone or other consumer electronics.

SUMMARY OF THE INVENTION

A narrow-band red-emitting phosphor may in embodiments have a general composition $MS_xSe_yA_z$:Eu, wherein M is at least one of Mg, Ca, Sr and Ba, A is at least one of C, N, B, P, and a monovalent combining group NCN (cyanamide), and may in some embodiments further include one or more of O, F, Cl, Br and I. In embodiments (1) $0.8<x+y<1.25$ (where $x\geq 0$ and $y\geq 0.1$) and $0<z\leq 0.05$, in some embodiments (2) $0.8<x+y<1.25$ (where $x\geq 0$ and $y\geq 0.1$) and $0<z\leq 0.03$, in some further embodiments (3) x+y is not equal to 1, $x\geq 0$, $y\geq 0.1$ and $0<z\leq 0.05$, in further embodiments (4) $1.0<x+y<1.25$ (where $x\geq 0$ and $y\geq 0.1$) and $0<z\leq 0.05$, and in yet further embodiments (5) x, y and z are determined strictly by charge balancing and have values which provide a charge balanced chemical formula.

Furthermore, the red-emitting phosphor can further comprise one or more of oxygen, fluorine, chlorine, bromine and iodine.

In one embodiment M is calcium. In other embodiments M is strontium.

In some embodiments A is carbon. Alternatively and/or in addition A is boron.

To improve the reliability of the red-emitting phosphor, various embodiments can further comprise a coating on individual ones of said phosphor particles, said coating comprising one or more materials chosen from the group consisting of aluminum oxide, silicon oxide, titanium oxide, zinc oxide, magnesium oxide, zirconium oxide, boron oxide, chromium oxide, calcium fluoride, magnesium fluoride, zinc fluoride, aluminum fluoride and titanium fluoride.

The red-emitting phosphor particles can have a particle size distribution defined by diameter, $D_{50}$, being in the range of 3.0 to 45.0 microns. Alternatively, the phosphor particles can have a particle size distribution defined by diameter, $D_{50}$, being in the range of 5.0 to 25.0 microns.

According to further aspects of the present invention, a white light emitting device may comprise: a blue and/or UV excitation source with a peak emission wavelength within a range from 400 nm to 480 nm; a coated narrow band red phosphor of the present invention; and phosphors with peak emission at shorter wavelengths, such as yellow, green, yellow/green and blue, for example. Furthermore, the narrow band red phosphor may be coated with alumina as described herein.

In embodiments that utilize a blue excitation source, the excitation source can have a peak emission wavelength within a range from 400 nm to 480 nm and in further embodiments a peak emission wavelength within a range from 450 nm to 480 nm.

In some embodiments the red-emitting phosphor particles absorb radiation at a wavelength of 450 nm and emit light with a photoluminescence peak emission wavelength between about 600 nm and about 630 nm. Preferably, the red-emitting phosphor has an emission peak full width half maximum of less than 55 nm.

According to further aspects of the present invention, the red phosphor of the present invention may be used for display applications when combined with narrow band green phosphors such as $SrGa_2S_4$:$Eu^{2+}$, $\beta$-sialon:$Eu^{2+}$ or cadmium-free quantum dots such as InP/ZnS quantum dots. In some embodiments white light illumination emitted by the display backlight covers an area including greater than 90% of the NTSC 1953 (National Television System Committee) color gamut specification as mapped on CIE 1931 xy chromaticity diagram. In some embodiments the color gamut may approach 94% of the area of the NTSC 1953 color standard.

According to further embodiments, a photoluminescence color display may comprise: a display panel comprising a plurality of red, green and blue pixel areas; a display backlight comprising red, green and blue phosphors, including a red phosphor of the present invention; and a color filter plate located on a side of the display panel that is distal to the white light illumination system, wherein the color filter plate comprises at least one of: first filter areas corresponding to red pixel areas of the display that are operable to allow the passage of red light; second filter areas corresponding to green pixel areas of the display that are operable to allow the passage of green light; and third filter areas corresponding to blue pixel areas of the display that are operable to allow the passage of blue light.

According to further embodiments, a display panel may comprise: a plurality of red, green and blue pixel areas; an excitation source operable to generate excitation radiation for operating the display, such as a blue LED; a photoluminescence color-elements plate comprising at least one of: a first photoluminescence material of the present invention corresponding to red pixel areas of the display that is operable to emit red light in response to said excitation radiation; a second photoluminescence material corresponding to green pixel areas of the display that is operable to emit green light in response to said excitation radiation; and a third photoluminescence material corresponding to blue pixel areas of the display that is operable to emit blue light in response to said excitation radiation; and a color filter plate located on a side of the display panel that is distal to the white light illumination system, wherein the color filter plate comprises at least one of: first filter areas corresponding to red pixel areas of the display that are operable to allow the passage of red light; second filter areas corresponding to green pixel areas of the display that are operable to allow the passage of green light; and third filter areas corresponding to blue pixel areas of the display that are operable to allow the passage of blue light.

According to some embodiments, a method of making a phosphor may comprise: combining in a crucible $MSeO_4$:Eu crystals, powdered sulphur and powdered material comprising A; and sintering the combined materials; grinding the sintered material; and washing the ground material; wherein M is at least one of Mg, Ca, Sr and Ba; wherein A comprises one or more of carbon, nitrogen, boron, phosphorous and a monovalent combining group NCN (cyanamide); wherein the amount of S is chosen to provide a desired stoichiometric ratio of Se to S; wherein the amount of A is between 2.0 and 5.5 wt. %; and wherein said phosphor has a composition represented by the chemical formula $MS_xSe_yA_z$:Eu, wherein $0<z≤0.5$ and $0.8<x+y<1.25$ (where $x≥0$ and $y≥0.1$). The method can further comprise adding a flux material in said combining, wherein said flux material is chosen from the group consisting of LiF, $NH_4Cl$, $CaCl_2$ and $NH_4Br$.

In some embodiments A is carbon. In other embodiments A is boric acid. A can be between 3.0 and 4.5 wt. % and in other embodiments A is between 3.3 and 4.3 wt. %.

BRIEF DESCRIPTION OF THE DRAWINGS

These and other aspects and features of the present invention will become apparent to those ordinarily skilled in the art upon review of the following description of specific embodiments of the invention in conjunction with the accompanying figures, wherein.

DETAILED DESCRIPTION OF THE INVENTION

Embodiments of the present invention will now be described in detail with reference to the drawings, which are provided as illustrative examples of the invention so as to enable those skilled in the art to practice the invention. Notably, the figures and examples below are not meant to limit the scope of the present invention to a single embodiment, but other embodiments are possible by way of interchange of some or all of the described or illustrated elements. Moreover, where certain elements of the present invention can be partially or fully implemented using known components, only those portions of such known components that are necessary for an understanding of the present invention will be described, and detailed descriptions of other portions of such known components will be omitted so as not to obscure the invention. In the present specification, an embodiment showing a singular component should not be considered limiting; rather, the invention is intended to encompass other embodiments including a plurality of the same component, and vice-versa, unless explicitly stated otherwise herein. Moreover, applicants do not intend for any term in the specification or claims to be ascribed an uncommon or special meaning unless explicitly set forth as such. Further, the present invention encompasses present and future known equivalents to the known components referred to herein by way of illustration.

A narrow band red phosphor may in embodiments have a general composition $MS_xSe_yA_z$:Eu, wherein M is at least one of Mg, Ca, Sr and Ba, A is at least one of C, N, B, P, and the monovalent combining group NCN (cyanamide), and may in some embodiments further include one or more of O, F, Cl, Br and I. In embodiments (1) $0.8<x+y<1.25$ (where $x\geq0$ and $y\geq0.1$) and $0<z\leq0.05$, in some embodiments (2) $x+y$ is not equal to 1, $x\geq0$, $y\geq0.1$ and $0<z\leq0.05$, in further embodiments (3) $1.0<x+y<1.25$ (where $x\geq0$ and $y\geq0.1$) and $0<z\leq0.05$, and in yet further embodiments (4) x, y and z are determined strictly by charge balancing. The narrow band red phosphor may in embodiments have a particle size distribution defined by $D_{50}$ in the range of 3 to 45 μm (microns), end points included, and in further embodiments $D_{50}$ in the range of 5 to 25 μm (microns), end points included. It is expected that the element A may be found in the phosphor material in one or more of the following positions: an interstitial position, a substitutional position, on a grain boundary or crystal surface, or within a second phase (such as within calcium fluoride).

Figure 1A:
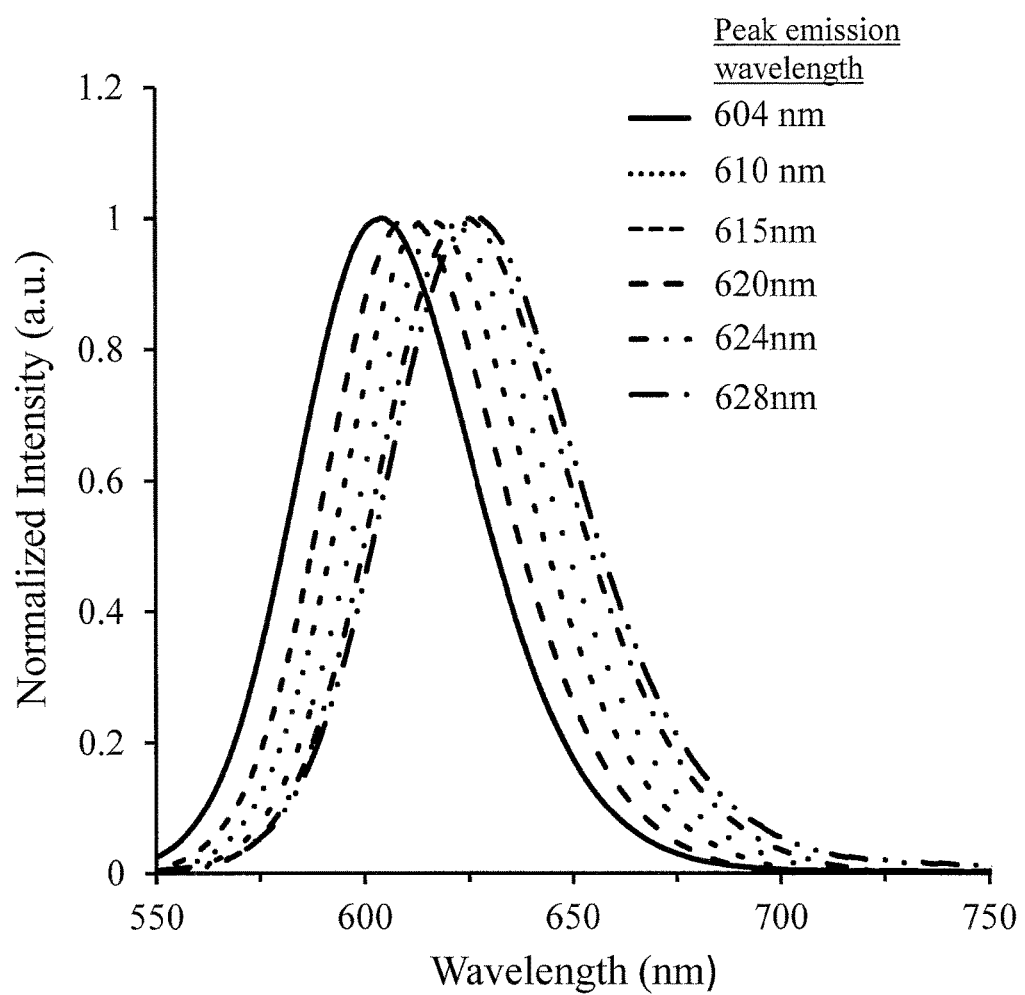
FIG. 1A shows normalized emission spectra of $CaS_xSe_yC_{0.01}Eu_{0.005}$ phosphors by adjusting the ratio of S/Se.
Figure 1B:
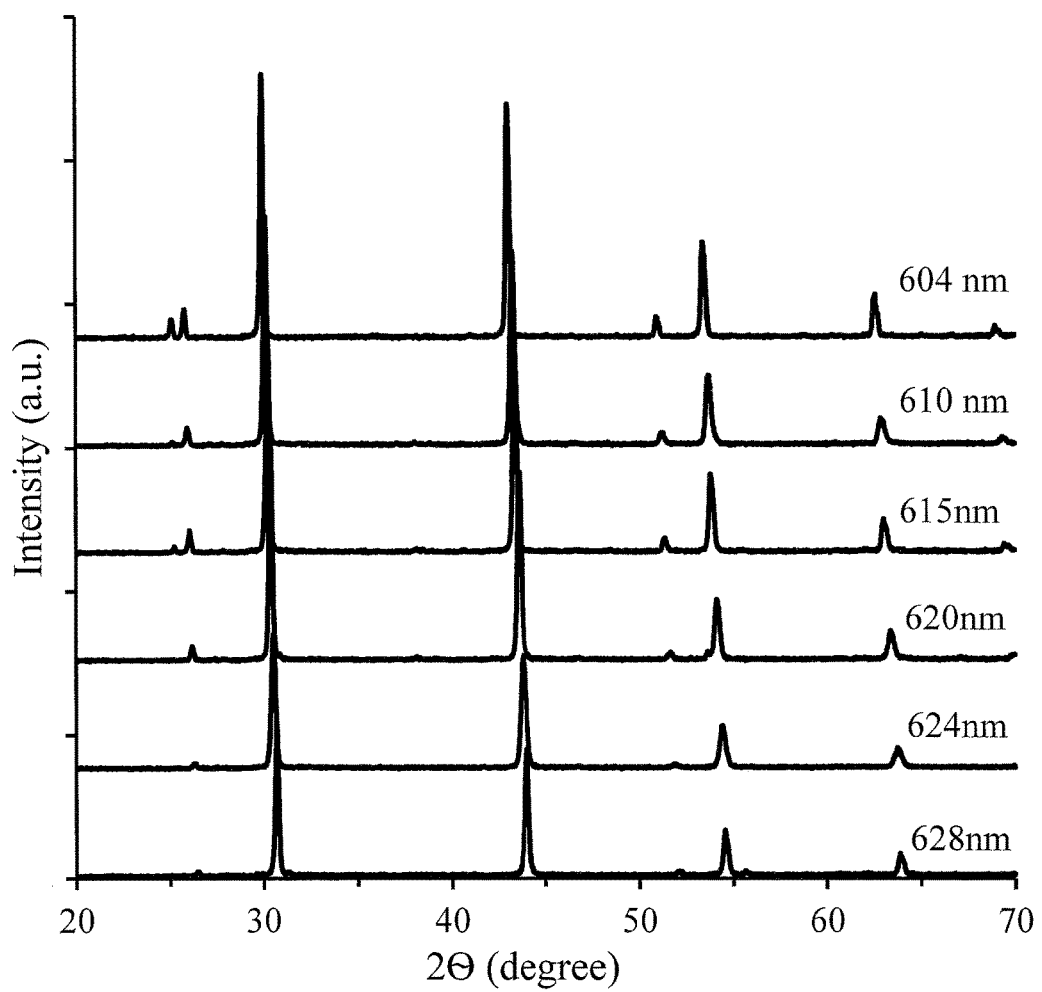
FIG. 1B shows the corresponding XRD patterns of $CaS_xSe_yC_{0.01}Eu_{0.005}$ phosphors, according to some embodiments.

FIG. 1A shows normalized emission spectra of $CaS_xSe_yC_{0.01}Eu_{0.005}$ phosphors (generally referred to herein as CSSC phosphors), the emission peak can tune from 604 nm to 628 nm by the ratio of S/Se in the composition, and FIG. 1B shows the corresponding XRD patterns of $CaS_xSe_yC_{0.01}Eu_{0.005}$ phosphors. The specific phosphors shown in FIGS. 1A & 1B are as follows: the phosphor with peak at 604 nm (FWHM 48 nm) is $CaS_{0.14}Se_{0.85}C_{0.01}Eu_{0.005}$ (CSSC 604); the phosphor with peak at 610 nm (FWHM 48 nm) is $CaS_{0.20}Se_{0.79}C_{0.01}Eu_{0.005}$ (CSSC 610); the phosphor with peak at 615 nm (FWHM 50 nm) is $CaS_{0.25}Se_{0.74}C_{0.01}Eu_{0.005}$ (CSSC 615); the phosphor with peak at 620 nm (FWHM 52 nm) is $CaS_{0.35}Se_{0.64}C_{0.01}Eu_{0.005}$ (CSSC 620) the phosphor with peak at 624 nm (FWHM 53 nm) is $CaS_{0.43}Se_{0.56}C_{0.01}Eu_{0.005}$ (CSSC 624); and the phosphor with peak at 628 nm (FWHM 54 nm) is $CaS_{0.52}Se_{0.47}C_{0.01}Eu_{0.005}$ (CSSN 628).

Figure 2A:
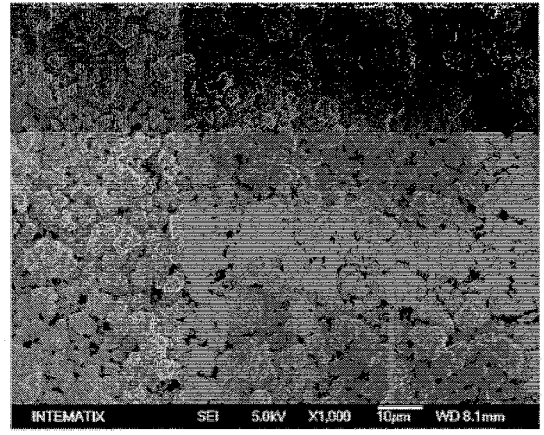
FIGS. 2A, 2B, 2C & 2D are SEM micrographs of $CaS_{0.25}Se_{0.75}C_z$:Eu phosphor particles, wherein the particles in FIG. 2A have a composition $CaS_{0.25}Se_{0.75}Eu_{0.003}$, without carbon, and the particles in FIGS. 2B, 2C & 2D have compositions given by $CaS_{0.25-z}Se_{0.75}C_zEu_{0.003}$ where z=0.005, 0.01, 0.03, according to some embodiments.
Figure 2B:
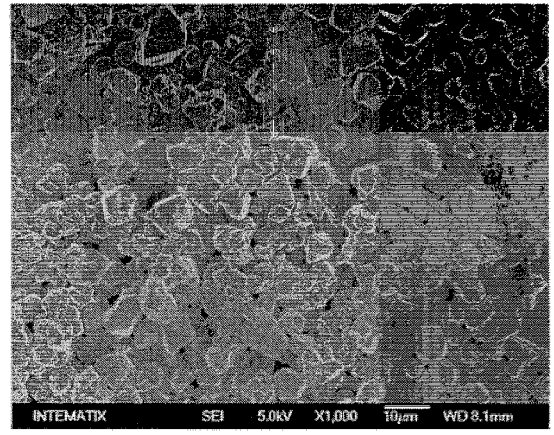
Figure 2C:
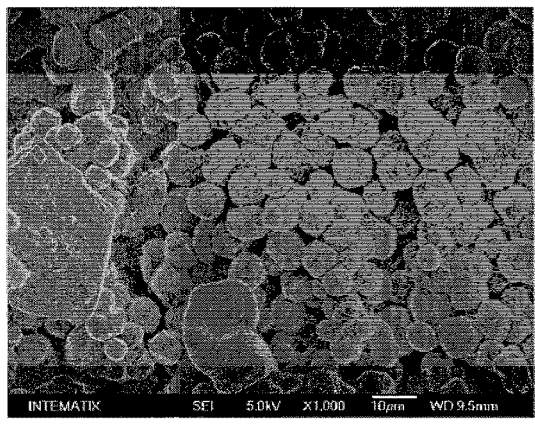
Figure 2D:
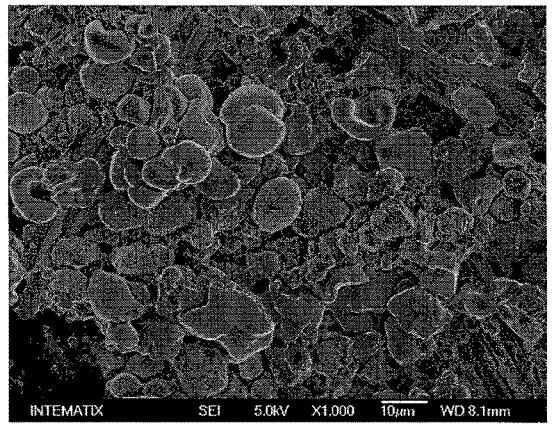
Figure 3A:
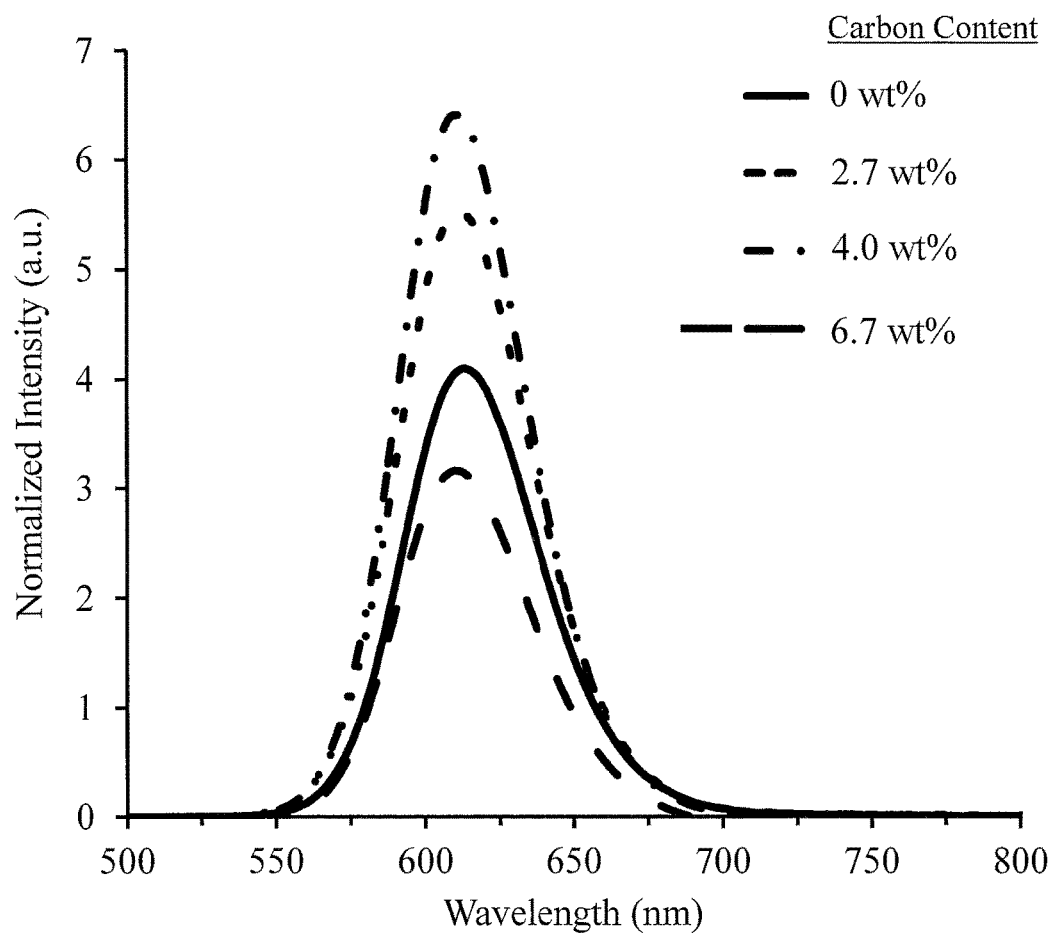
FIGS. 3A & 3B show photo-luminescent intensity as a function of wavelength and carbon loading in raw materials for phosphors with compositions $CaS_{0.25-z}Se_{0.75}C_z$:Eu, (examples of z being shown from the range z=0 to 0.03), according to some embodiments.
Figure 3B:
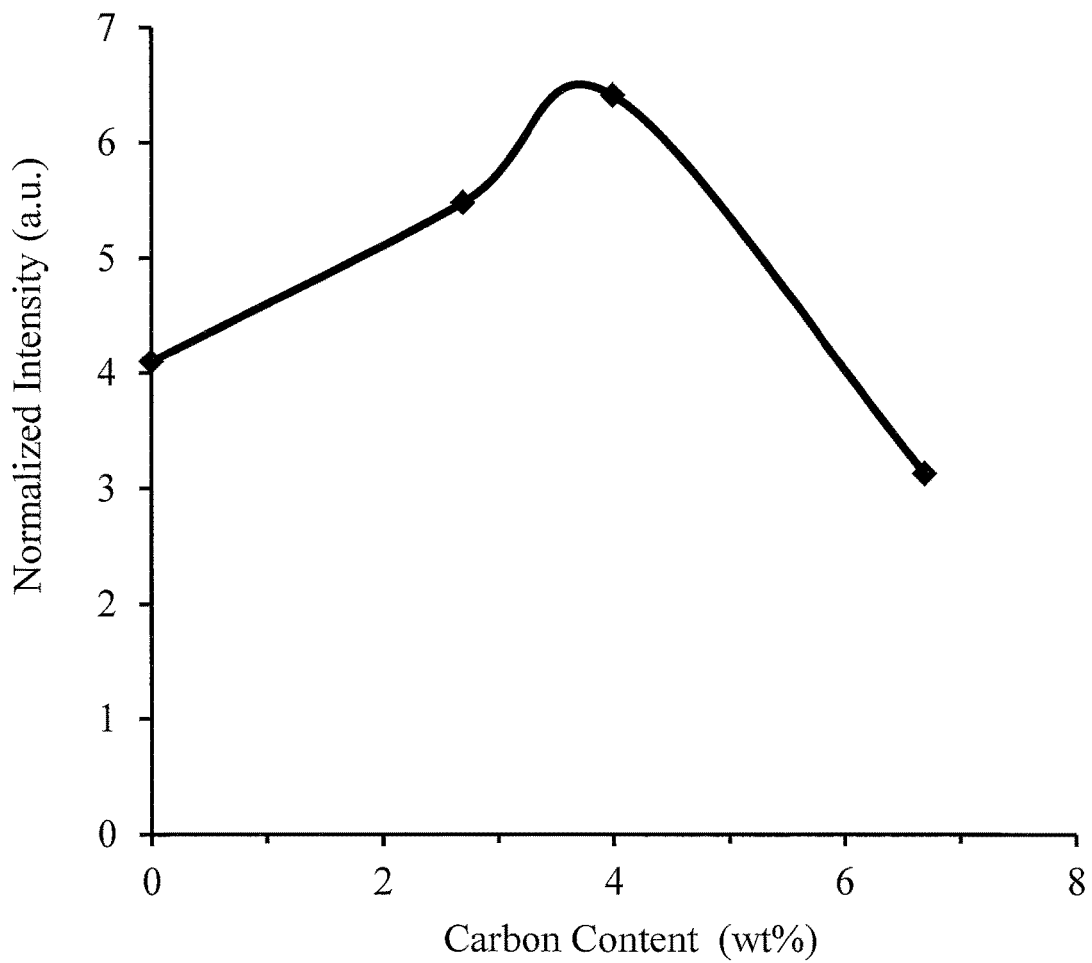
Figure 3C:
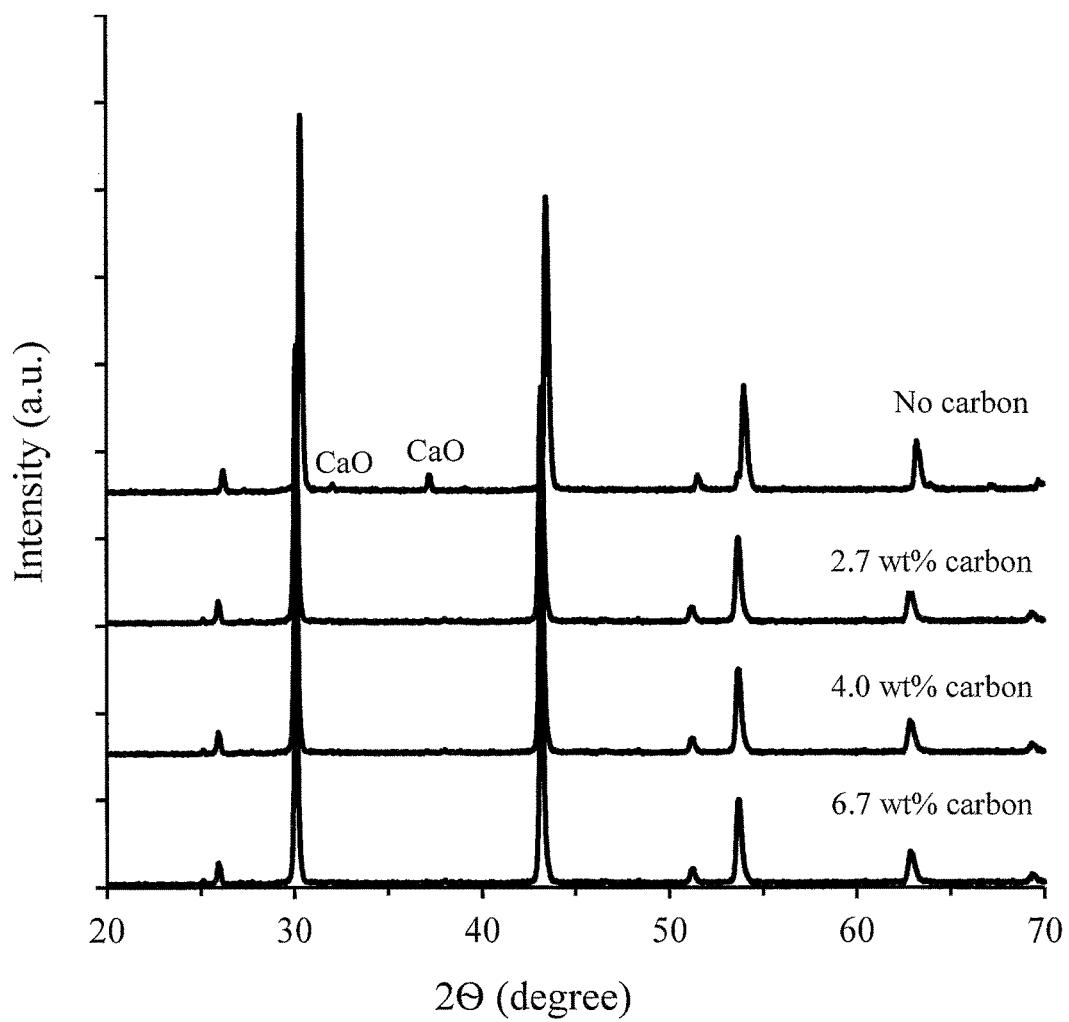
FIG. 3C shows the corresponding XRD patterns of the phosphors of FIGS. 3A & 3B.

The addition of a source of carbon such as graphite, carbon black or activated carbon, organic polymers or other carbohydrate compounds for another source of carbon to the other ingredients for sintering to form the phosphors of general composition $MS_xSe_yC_z$:Eu appears to be associated with a desirable 1 μm to 10 μm scale particle size and roughly spherical shape for facilitating coating of the particles by a CVD process to form a hermetic coating. FIG. 2 shows SEM micrographs of particles with general formulas $MS_xSe_yA_z$:Eu, wherein the particles shown in FIG. 2A had no carbon added during synthesis, and the particles shown in FIGS. 2B, 2C & 2D had 2.7, 4.0 and 6.7% by weight (wt. % of carbon compared to $CaSeO_4$) of activated carbon added in mixed precursors during synthesis, respectively. Further details of the synthesis of these materials are provided below by way of Examples. Note that the particle size is increased from submicron as shown in FIG. 2A to roughly 5 μm to 10 μm in diameter as shown in FIGS. 2B, 2C & 2D due to the addition of carbon. Furthermore, the phosphor with 4.0 wt. % carbon shows particles that appear to be more uniformly spherical than those in FIGS. 2A, 2C & 2D, and it is this same phosphor that shows the best PL intensity, as described below. Importantly, the addition of carbon did not only increase photoluminescence intensity, but also narrowed the FWHM of the red emission peak from 55 nm to 50 nm, as seen in FIGS. 3A & 3B and Table 1B. FIG. 3C shows the XRD patterns of these phosphors. It is noted that the XRD spectra show CaO peaks only for compositions without the addition of carbon. These results show an optimization of phosphor PL intensity with added carbon (measured as wt. % of $CaSeO_4$ raw material) of between 2.0 and 5.5 wt. %, in embodiments between 3.0 and 4.5 wt. % and in further embodiments between 33 and 4.3 wt. %.

Figure 4:
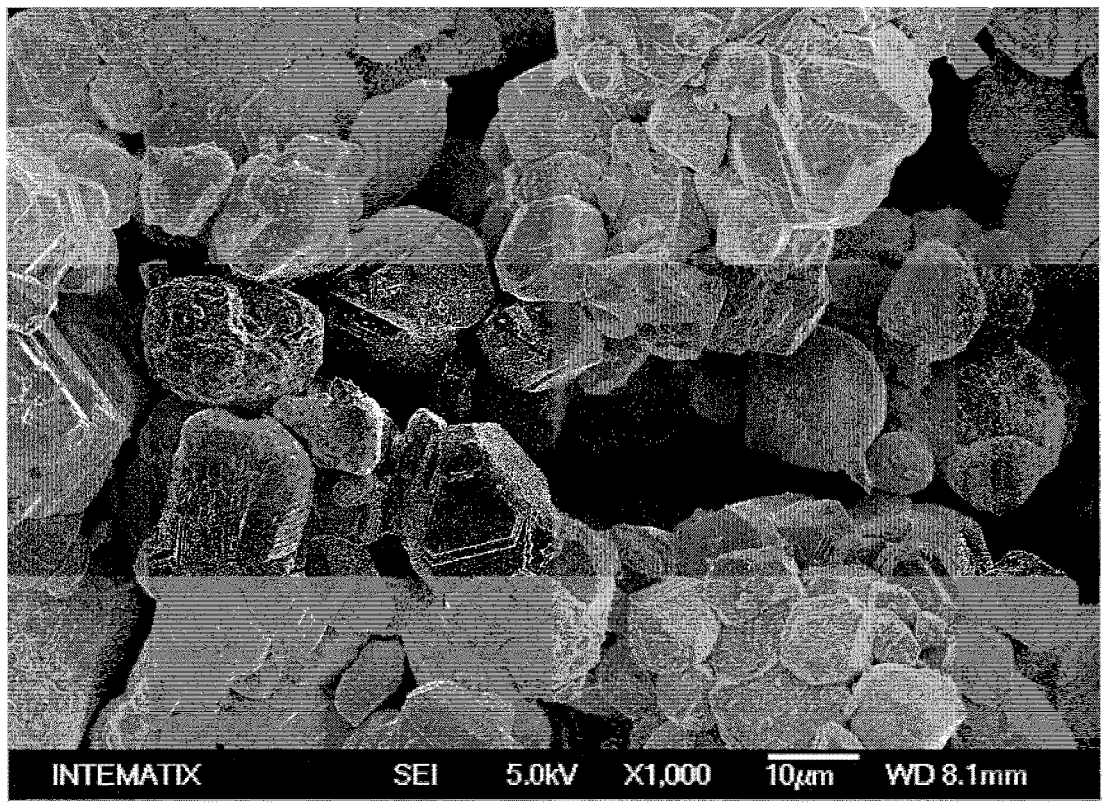
FIG. 4 shows an SEM image of $CaS_{0.4}Se_{0.6}B_{0.08}Eu_{0.05}$ phosphor particles, according to some embodiments.

Furthermore, in some embodiments boron may be added to Ca(Se,S):Eu materials for increasing photo-luminescent quantum efficiency and improving particle morphology, boron-containing compounds showed similar results to those described above for carbon-containing Ca(Se,S):Eu materials. FIG. 4 shows particle morphology of $CaS_{0.4}Se_{0.6}B_{0.08}Eu_{0.005}$ phosphors made from raw materials with 3.0 wt. % boric acid compared to $CaSeO_4$. The phosphor is seen to have a desirable 1 μm to 10 μm scale particle size and with a roughly spherical shape, for facilitating coating of the particles by a CVD process to form a hermetic coating. Comparison with FIG. 2A shows a significant change in particle morphology with the addition of boron. PL data for this material shows an emission peak at 620 nm with FWHM of 51 nm.

Figure 5:
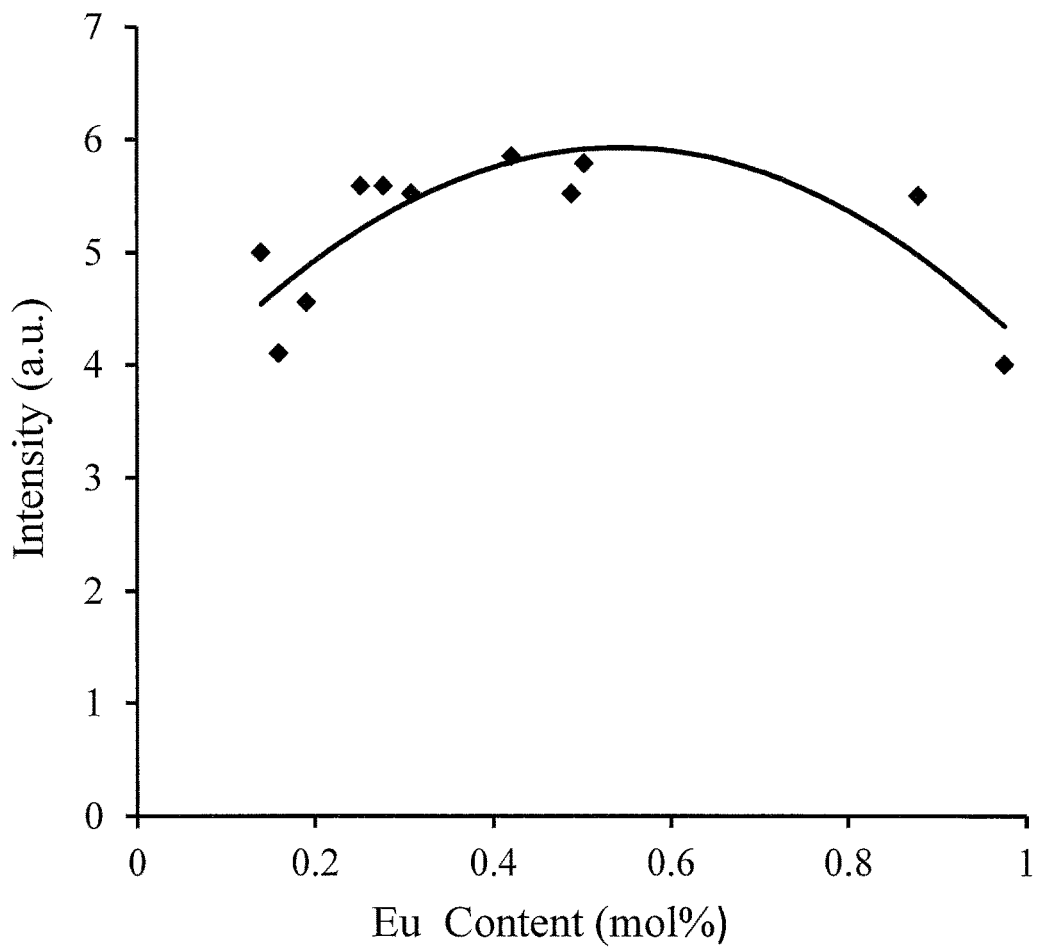
FIG. 5 shows a plot of emission intensity against europium concentration for $CaS_{0.25}Se_{0.74}C_{0.01}$:Eu phosphors, according to some embodiments.

FIG. 5 shows the emission intensities of phosphors with the general composition $CaS_{0.25}Se_{0.75}C_{0.01}$:Eu at various europium concentrations, where the maximum emission intensity is obtained at around 0.5% (mole percentage) europium. It is thought that a significant amount of light emitted by $Eu^{2+}$ ions starts to be absorbed by the nearest neighbor $Eu^{2+}$ ions when the europium ion concentration gets above about 0.5 mole percent, causing diminution of the emission efficiency.

Examples of the synthesis of $MS_xSe_yA_z$:Eu phosphors according to embodiments of the invention are provided herein.

Example 1: Synthesis of 120 g of $CaSeO_4$ with 0.3 wt. % $Eu_2O_3$

After dissolving 83.4 g $SeO_2$ in 300 ml of de-ionized water in a beaker, 45.0 g of 30% $H_2O_2$ solution was slowly added, then stirred for about 1 hour. Ammonium hydroxide (29 wt. %) was then slowly added to the solution until the pH reached approximately 10—this is solution #1.

110.0 g of $CaCl_2.2H_2O$ was dissolved in 450 ml of ethanol in another beaker, then 0.40 g of $Eu_2O_3$ powder was added, followed by 36% HCl which was slowly added until the solution became clear—this is solution #2.

The solution of $(NH_4)_2SeO_4$ (solution #1) was added dropwise to solution #2 precipitating white crystals; the solution with precipitates was stirred for about 2 hours, then the solution was filtered and the precipitates were dried at 80° C.

Example 2: Synthesis of $CaS_{0.25-z}Se_{0.75}C_zEu_{0.003}$ Phosphors 30 g of white $CaSeO_4$ with 0.3 wt. % Eu powder was mixed with 1.2 g of sulfur powder and 1.2 g powdered carbon (such as Alfa Aesar:carbon black, 99.9+%). The mixture was put in an alumina crucible with an alumina cover and fired at 600° C. for 2 hours under 5% hydrogen balanced with nitrogen, then the temperature was increased to 900° C. for 4 hours. Furthermore, in embodiments, amounts of LiF, $NH_4Cl$, $CaCl_2$ or $NH_4Br$ may also be added as a flux. In other embodiments, 0.9 g of boric acid may be used in place of the powdered carbon to make $MS_xSe_yB_z$:Eu phosphors, similarly calcium nitride, phosphorus pentasulfide and calcium cyanamide may be used in place of carbon as sources of N, P and NCN in the phosphor material.

Example 3: Washing as-Synthesized $CaS_{0.25-z}Se_{0.75}C_zEu_{0.003}$ Phosphors The above as-synthesized phosphors were ground in a ceramic mortar, then placed in 600 ml of methanol solution in a 1.0 liter beaker and stirred for 1 hour, then the phosphor particles were allowed to settle, the solvents were decanted off the phosphor particles, and the particles were dried.

Table 1A provides the composition of starting materials for Samples 1 through 5.

TABLE 1A

| Compound | $CaSeO_4 \cdot 0.3\%Eu_2O_3$ (g) | Carbon (g) | Sulfur (g) | $CaCl_2$ (g) |
|---|---|---|---|---|
| Sample 1 | 30 | — | 1.2 | — |
| Sample 2 | 30 | — | 1.2 | 1.5 |
| Sample 3 | 30 | 0.8 | 1.2 | 1.5 |
| Sample 4 | 30 | 1.2 | 1.2 | 1.5 |
| Sample 5 | 30 | 2.0 | 1.2 | 1.5 |

Table 1B provides emission peak wavelength, PL intensity and the FWHM of the emission peak for Samples 1 through 5.

TABLE 1B

| Compound | Composition | Emission Peak (nm) | PL Intensity (a.u.) | FWHM (nm) |
|---|---|---|---|---|
| Sample 1 | $CaS_{0.22}Se_{0.66}O_{0.12}Eu_{0.003}$ | 613 | 3.9 | 55 |
| Sample 2 | $CaS_{0.25}Se_{0.75}Eu_{0.003}$ | 612 | 4.0 | 55 |
| Sample 3 | $CaS_{0.25}Se_{0.75}C_{0.005}Eu_{0.003}$ | 611 | 5.4 | 51 |
| Sample 4 | $CaS_{0.24}Se_{0.75}C_{0.01}Eu_{0.003}$ | 610 | 6.4 | 50 |
| Sample 5 | $CaS_{0.22}Se_{0.75}C_{0.03}Eu_{0.003}$ | 610 | 3.2 | 50 |

The final products were tested using an Ocean Optics USB4000 spectrometer for photoluminescence intensity (PL) and chromaticity (CIE coordinates x and y). The x-ray diffraction (XRD) patterns of the phosphors were measured using the $K_\alpha$ line of a Cu target. FIG. 3A shows the emission spectra of the phosphors Samples 2 through 5. A comparison of sample 1 and sample 2 in Table 1B also shows that the addition of $CaCl_2$ as a flux did not significantly affect the emission peak position and intensity; furthermore, it is thought that the shift in emission peak position and intensity for the carbon-containing samples 3-5 relative to sample 2 may be attributed to the addition of carbon. Powder x-ray diffraction measurements using the $K_\alpha$ line of a Cu target for Samples 2 through 5 are shown in FIG. 3C.

In some embodiments, the narrow band red phosphor particles may be coated with one or more oxides, for example: aluminum oxide ($Al_2O_3$), silicon oxide ($SiO_2$), titanium oxide ($TiO_2$), zinc oxide (ZnO), magnesium oxide (MgO), zirconium oxide ($ZrO_2$), boron oxide ($B_2O_3$) or chromium oxide (CrO). Alternatively and/or in addition the narrow band red phosphor particles may be coated with one or more flourides, for example: calcium fluoride ($CaF_2$), magnesium fluoride ($MgF_2$), zinc fluoride ($ZnF_2$), aluminum fluoride ($AlF_3$) or titanium fluoride ($TiF_4$). In embodiments, the coatings may be a single layer, or multiple layers with combinations of the aforesaid coatings. Herein the combination coatings may be coatings with an abrupt transition between the first and second materials, or may be coatings in which there is a gradual transition from the first material to the second material thus forming a zone with mixed composition that varies through the thickness of the coating.

Figure 15:
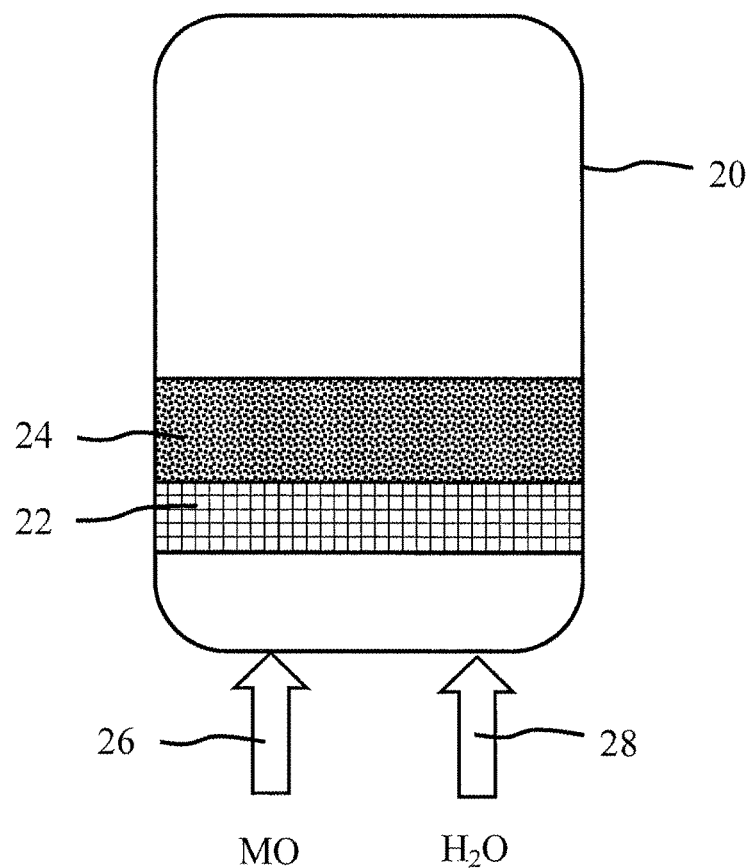
FIG. 15 is a schematic representation of a phosphor particle coating apparatus according to some embodiments of the invention.

In some embodiments the particles are coated by a CVD process in a fluidized bed reactor. FIG. 15 is a schematic representation of a phosphor particle coating apparatus according to some embodiments of the invention. Reactor 20 comprises a porous support disc 22, over which phosphor powder 24 is held, and inlets 26 and 28 for metal organic precursor and water vapor, respectively. The thickness of the coating may typically be in the range of 100 nm to 5 µm, in embodiments in the range of 50 nm to 100 nm, 100 nm to 500 nm, 500 nm to 1 µm, or 1 µm to 2 µm. Herein, unless otherwise specified, coated narrow band red phosphor particle samples used in the examples herein are coated with approximately 1 µm of alumina ($Al_2O_3$).

In a typical coating process, the phosphor powder sample was loaded into the reactor and heated to 100-250° C., preferably 200° C., under $N_2$ gas flow. When an oxide coating is to be deposited, a metal organic oxide precursor MO such as TrimethylAluminum (TMA), Titanium tetra-chloride ($TiCl_4$), Silicon tetra-chloride ($SiCl_4$), or DimethylZinc was introduced in to the reactor 20 through inlet 26 with a $N_2$ carrier gas through a bubbler. $H_2O$ vapor was also introduced into the reactor 20 through inlet 28 to react with the metal oxide precursor to form oxide coating layers on phosphor particles. Complete fluidization of the particles being coated (from gas flow optimization, etc.) without any dead space is important to ensure homogeneous coating of all phosphor particles. In a typical coating conducted at 200° C., for a 250 g phosphor particle loading of the reactor, the coating was produced with a metal oxide precursor feeding rate of 1 to 10 g/hour for 4 hours, while feeding $H_2O$ at a rate of 2 to 7 g/hour. It is shown below that these conditions can produce dense and pinhole free coatings and the present inventors expect that these conditions are required to produce dense substantially pin-hole free coatings of uniform thickness, with theorized bulk density for the coatings of greater than 95% and in embodiments greater than 99%. It is expected by the present inventors that outside of: the specified feeding rate range for oxide precursor, the specified feeding rate range for $H_2O$, and/or the specified 100-250° C. temperature range, the coated phosphors will not exhibit the reliability documented herein.

A variation of the phosphor particle coating apparatus of FIG. 15 for depositing a fluoride coating comprises introducing a metal organic fluoride MF precursor in to the reactor 20 through inlet 26 with a $N_2$ carrier gas through a bubbler. When depositing a fluoride coating no $H_2O$ is introduced into the reactor. In other respects coating with a fluoride is analogous to coating with an oxide as described above.

White Light Emitting Device

Figure 6:
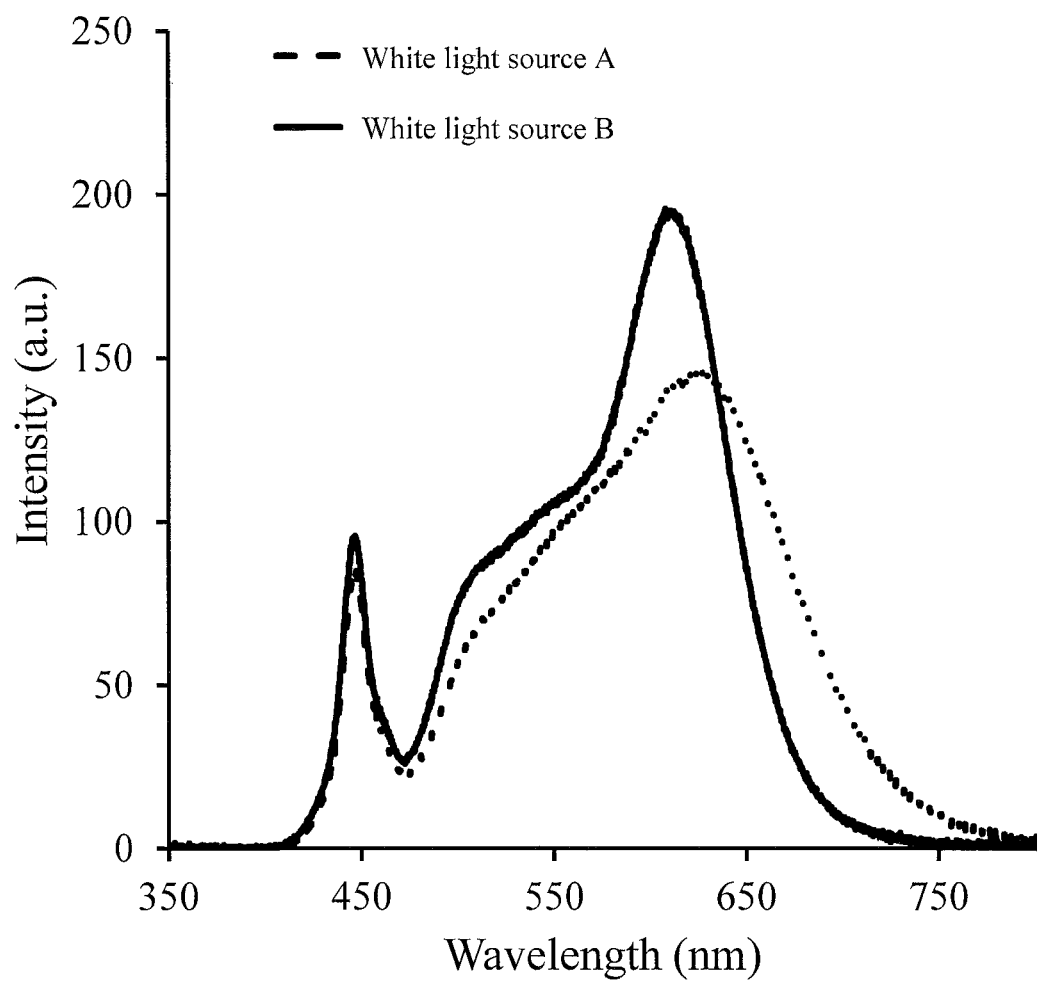
FIG. 6 shows white light emission spectra of a blue LED combined with (A) a red nitride phosphor and a green garnet phosphor and (B) a narrow band $CaS_{0.43}Se_{0.56}C_{0.01}Eu_{0.004}$ red phosphor and a green garnet phosphor, according to some embodiments.

In embodiments of the present invention, a white light emitting device may comprise: a blue and/or UV excitation source; a coated narrow band red phosphor of the present invention; and phosphors with peak emission at shorter wavelengths, such as yellow, green, yellow/green and blue. For example, a white light emitting device may comprise: an excitation source with emission wavelength within a range from 200 nm to 480 nm; red-emitting phosphor particles with a composition represented by the chemical formula $MS_xSe_yA_z$:Eu, wherein M is at least one of Mg, Ca, Sr and Ba, A is at least one of C, N, B, P, and the monovalent combining group NCN(cyanamide), and may in some embodiments further include one or more of O, F, Cl, Br and I. In embodiments (1) $0.8 < x+y < 1.25$ (where $x \geq 0$ and $y \geq 0.1$)

and $0<z\leq0.05$, in some embodiments (2) x+y is not equal to 1, $x\geq0$, $y\geq0.1$ and $0<z\leq0.05$, in further embodiments (3) $1.0<x+y<1.25$ (where $x\geq0$ and $y\geq0.1$) and $0<z\leq0.05$, and in yet further embodiments (4) x, y and z are determined strictly by charge balancing. In order to increase the phosphor stability, the phosphor particles may have a first coating layer including one or more of silicon oxide, aluminum oxide, titanium oxide, zinc oxide, zirconium oxide and boron oxide, and optionally a second coating layer including one or more of silicon oxide, aluminum oxide, titanium oxide, zinc oxide, zirconium oxide, boron oxide, calcium fluoride and strontium fluoride. The red-emitting phosphor particles absorb radiation at a wavelength of approximately 450 nm and emit light with a photoluminescence peak emission wavelength between about 600 nm and about 645 nm; and a green or yellow-emitting phosphor (aluminate-based or silicate-based, for example) such as a cerium doped lutetium aluminum garnet phosphor, a cerium doped yttrium aluminum garnet phosphor or $(Ba,Sr)_2SiO_4$:Eu emits light having a peak emission wavelength in the range from about 515 nm to about 570 nm. FIG. 6 shows a white light emission spectrum of such a white light emitting device—white light source B—at CCT of approximately 3000 K and CRI of approximately 90 with a blue LED (451.8 nm) combined with green/yellow phosphors (a lutetium aluminum garnet phosphor with peak emission at approximately 535 nm, herein described as GAL 535) and a narrow band red phosphor of the present invention $CaS_{0.43}Se_{0.56}C_{0.01}Eu_{0.004}$ (peak emission at about 625 nm) coated with 1000 nm of alumina, according to some embodiments of the present invention. For comparison, white light source A is shown which is a blue LED (451.8 nm) combined with green/yellow phosphors (a lutetium aluminum garnet phosphor with peak emission at approximately 535 nm) and a red nitride $CaAlSiN_3$:Eu phosphor (peak PL emission at about 645 nm, referred to herein as CASN 645). The narrow band red phosphor of the present invention—$CaS_{0.43}Se_{0.56}C^{0.01}Eu_{0.004}$ (with peak emission at about 625 nm—CSSC 625) coated with 1000 nm of alumina—combined with green garnet phosphors has more than 10% greater luminous efficacy (see Tables 2A, 2B & 2C) compared with the red nitride phosphors ($CaAlSiN_3$:Eu) combined with the same green or yellow-emitting phosphor (GAL 535) at CCT 2700K, 3000K and 4000K with CRI 90;

the better luminous efficacy is because parts of the emission spectrum outside the sensitivity range of the human eye for the narrow band red phosphor of the present invention are relatively small compared with these other red phosphors. See FIG. 6, which shows minimal emission above approximately 700 nm for White Light Source B with the red phosphor of the present invention, above which wavelength the human eye has little or no sensitivity.

Table 2A: Performance comparison for a nominal CCT 4000K, CRI 90 white light emitting devices comprising a blue LED (451.8 nm); GAL 535 phosphor; and (i) CASN 630 and (ii) alumina coated narrowband red phosphor (CSSC 625) of the present invention.

TABLE 2A

| White Light Device | Flux (lm) | Brightness (%) | CE (lm/W) | CIE x | CIE y | CCT (K) | Ra |
|---|---|---|---|---|---|---|---|
| CASN 630 + GAL 535 | 1875 | 100.0 | 202.6 | 0.3854 | 0.3866 | 3941 | 89.1 |
| CSSC 625 + GAL 535 | 2103 | 112.1 | 227.2 | 0.3940 | 0.3904 | 3758 | 90.3 |

Table 2B: Performance comparison for a nominal CCT 3000K, CRI 90 white light emitting devices comprising a blue LED (451.8 nm); GAL 535 phosphor; and (i) CASN 645 and (ii) alumina coated narrowband red phosphor (CSSC 623) of the present invention.

TABLE 2B

| White Light Device | Flux (lm) | Brightness (%) | CE (lm/W) | CIE x | CIE y | CCT (K) | CRI | R9 |
|---|---|---|---|---|---|---|---|---|
| CASN 645 + GAL 535 | 7.144 | 100.0 | 204.8 | 0.4369 | 0.4042 | 3002 | 91.5 | 60.7 |
| CSSC 623 + GAL 535 | 8.449 | 118.3 | 243.0 | 0.4369 | 0.4041 | 2998 | 88.8 | 16.9 |

Table 2C: Performance comparison for a nominal CCT 2700K, CRI 90 white light emitting devices comprising a blue LED (451 nm); GAL 535 phosphor; and (i) CASN 645 and (ii) alumina coated narrowband red phosphor (CSSC 625) of the present invention.

TABLE 2C

| White Light Device | Flux (lm) | Brightness (%) | CE (lm/W) | CIE x | CIE y | CCT (K) | CRI | R9 |
|---|---|---|---|---|---|---|---|---|
| CASN 645 + GAL 535 | 7.240 | 100.0 | 185.8 | 0.4600 | 0.4104 | 2697 | 91.0 | 56.5 |
| CSSC 625 + GAL 535 | 8.590 | 118.6 | 220.6 | 0.4599 | 0.4107 | 2700 | 90.4 | 27.5 |

Figure 7:
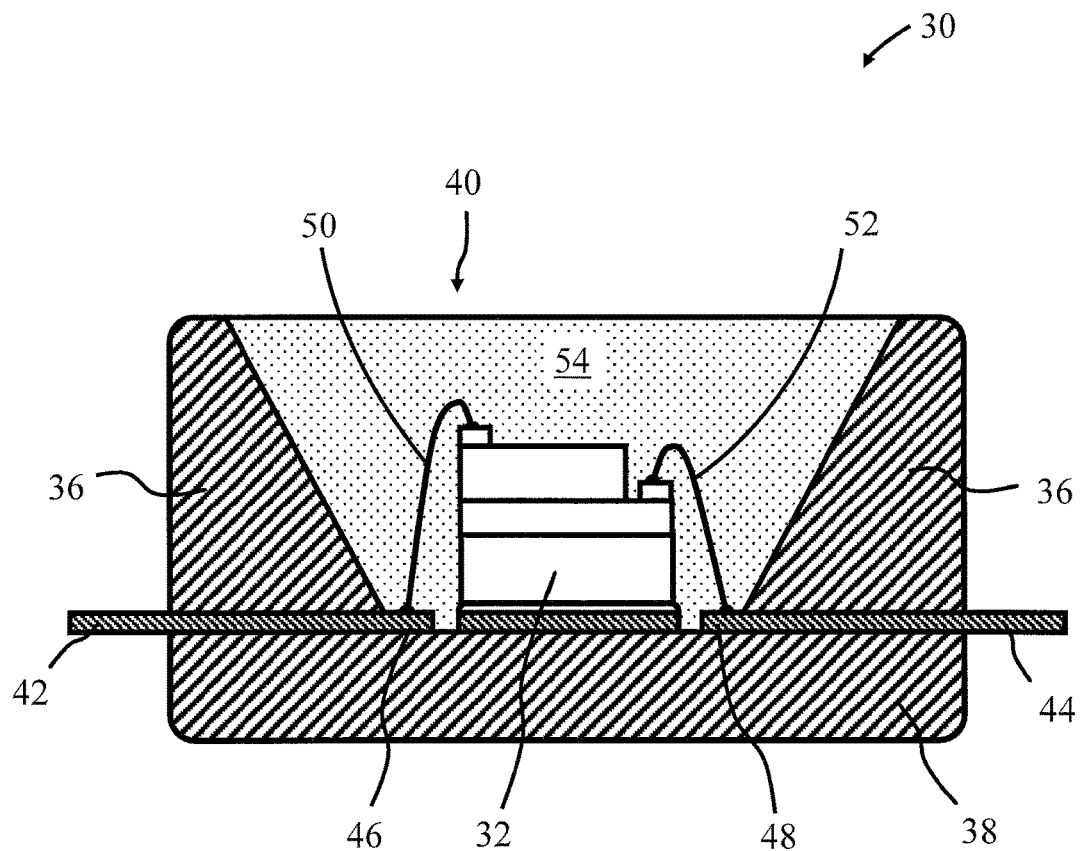
FIG. 7 shows a light emitting device, according to some embodiments.

FIG. 7 illustrates a light emitting device, according to some embodiments. The device 30 can comprise a blue light emitting, within the range of 450 nm to 470 nm, GaN (gallium nitride) LED chip 32, for example, housed within a package. The package, which can for example comprise a low temperature co-fired ceramic (LTCC) or high temperature polymer, comprises upper and lower body parts 36, 38. The upper body part 36 defines a recess 40, often circular in shape, which is configured to receive the LED chip(s) 32. The package further comprises electrical connectors 42 and 44 that also define corresponding electrode contact pads 46 and 48 on the floor of the recess 40. Using adhesive or solder, the LED chip 32 can be mounted to a thermally conductive pad located on the floor of the recess 40. The LED chip's electrode pads are electrically connected to corresponding electrode contact pads 46 and 48 on the floor of the package using bond wires 50 and 52 and the recess 40 is completely filled with a transparent polymer material 54, typically a silicone, which is loaded with a mixture of a yellow, red and/or green phosphor and including (coated) phosphor material of the present invention such that the exposed surfaces of the LED chip 32 are covered by the phosphor/polymer material mixture. To enhance the emission brightness of the device the walls of the recess are inclined and have a light reflective surface.

Figure 8A:
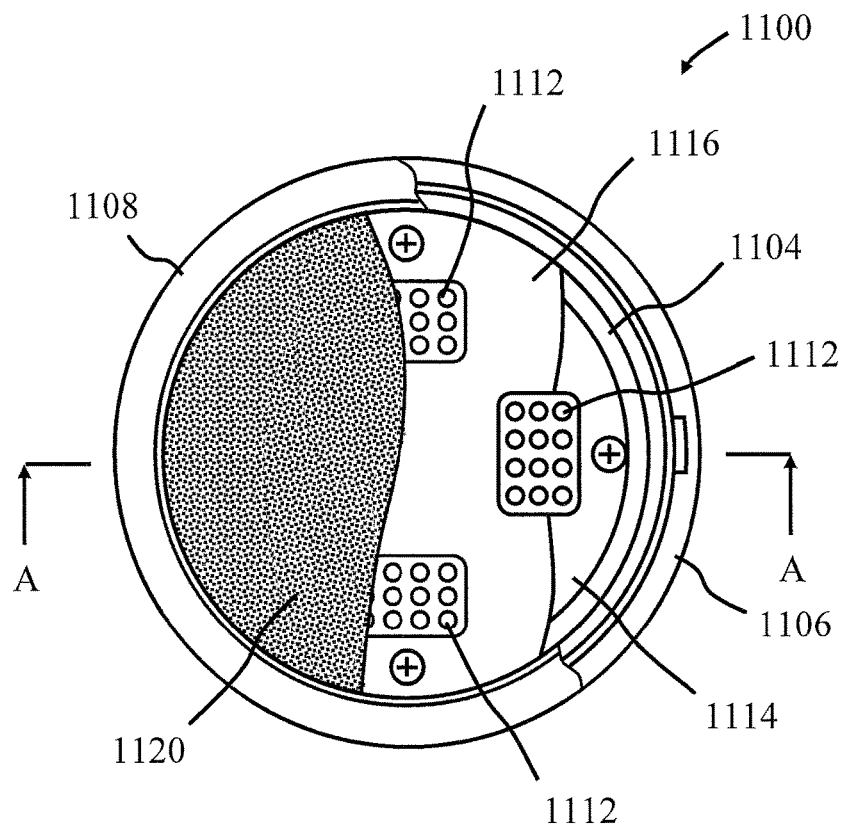
FIGS. 8A & 8B show a solid-state light emitting device, according to some embodiments.
Figure 8B:
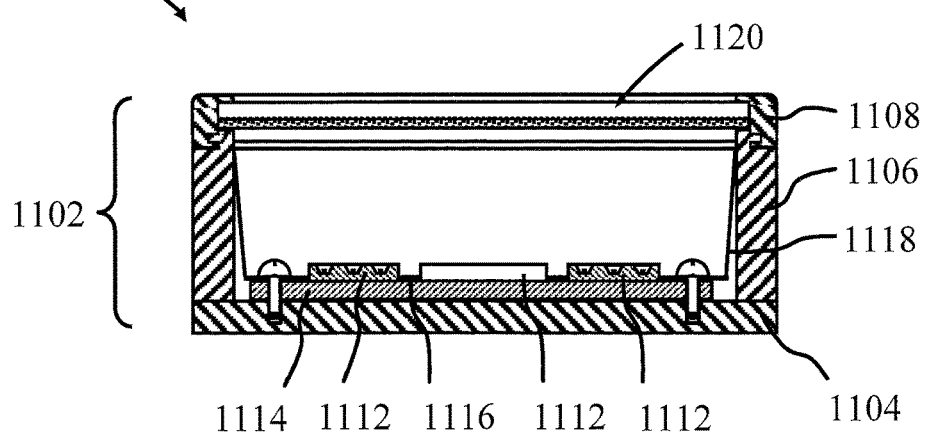

FIGS. 8A and 8B illustrate a solid-state light emitting device, according to some embodiments. The device 1100 is configured to generate warm white light with a CCT (Correlated Color Temperature) of approximately 3000K and a luminous flux of approximately 1000 lumens and can be used as a part of a downlight or other lighting fixture. The device 1100 comprises a hollow cylindrical body 1102 composed of a circular disc-shaped base 1104, a hollow cylindrical wall portion 1106 and a detachable annular top 1108. To aid in the dissipation of heat, the base 1104 is preferably fabricated from aluminum, an alloy of aluminum or any material with a high thermal conductivity. The base 1104 can be attached to the wall portion 1106 by screws or bolts or by other fasteners or by means of an adhesive.

The device 1100 further comprises a plurality (four in the example illustrated) of blue light emitting LEDs 1112 (blue LEDs) that are mounted in thermal communication with a circular-shaped MCPCB (metal core printed circuit board) 1114. The blue LEDs 1112 can comprise a ceramic packaged array of twelve 0.4 W GaN-based (gallium nitride-based) blue LED chips that are configured as a rectangular array 3 rows by 4 columns.

To maximize the emission of light, the device 1100 can further comprise light reflective surfaces 1116 and 1118 that respectively cover the face of the MCPCB 1114 and the inner curved surface of the top 1108. The device 1100 further comprises a photoluminescent wavelength conversion component 1120 that is operable to absorb a proportion of the blue light generated by the LEDs 1112 and convert it to light of a different wavelength by a process of photoluminescence. The emission product of the device 1100 comprises the combined light generated by the LEDs 1112 and the photoluminescent wavelength conversion component 1120. The photoluminescent wavelength conversion component may be formed of a light transmissive material (for example, polycarbonate, acrylic material, silicone material, etc.) and comprises a mixture of a yellow, red and/or green phosphor, including (coated) red phosphor material of the present invention. Furthermore, in embodiments the photoluminescent wavelength conversion component may be formed of a light transmissive material coated with phosphor material as described above, including (coated) red phosphor material of the present invention. The wavelength conversion component is positioned remotely to the LEDs 1112 and is spatially separated from the LEDs. In this patent specification "remotely" and "remote" means in a spaced or separated relationship. The wavelength conversion component 1120 is configured to completely cover the housing opening such that all light emitted by the lamp passes through the component 1120. As shown the wavelength conversion component 1120 can be detachably mounted to the top of the wall portion 1106 using the top 1108 enabling the component and emission color of the lamp to be readily changed.

Display Backlights

Figure 9:
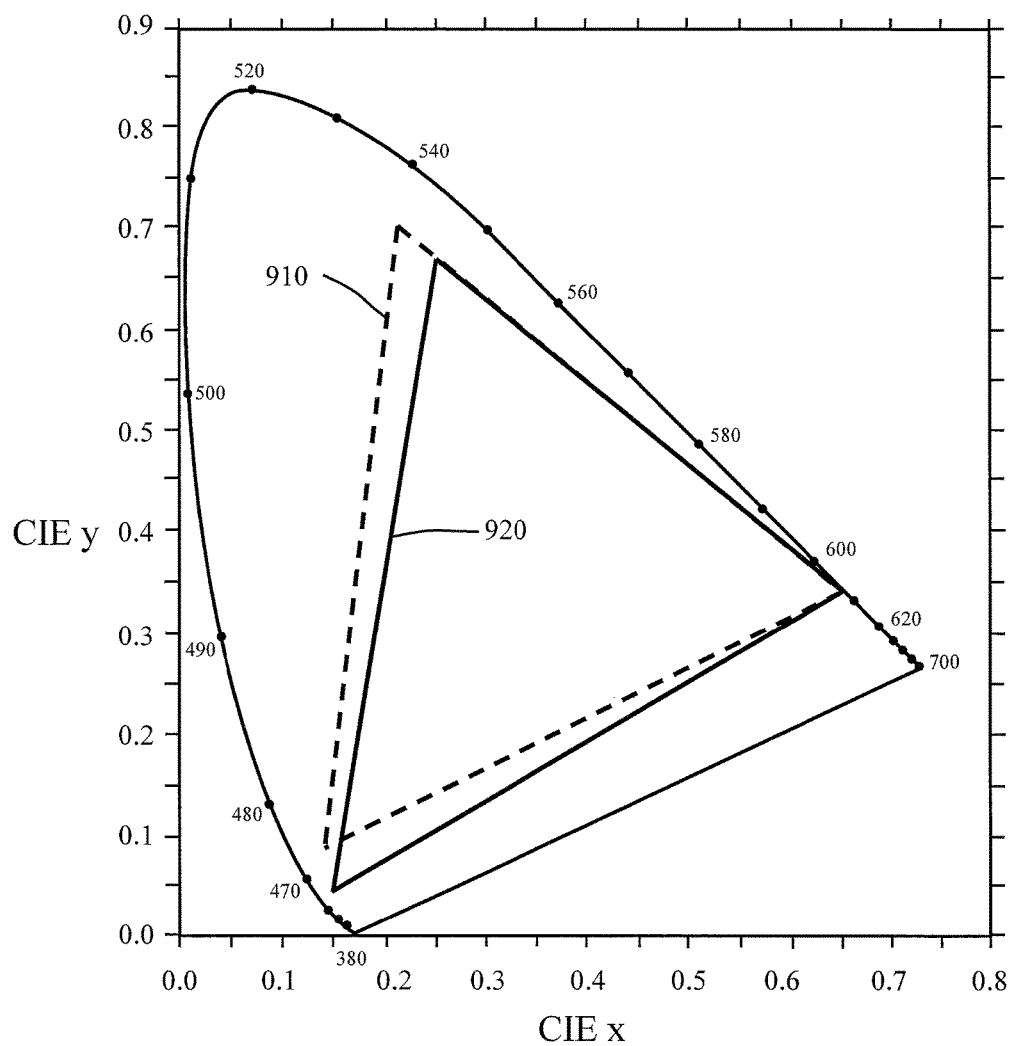
FIG. 9 shows the 1931 CIE color coordinates of the NTSC standard and the calculated RGB color coordinates from the white light source for which a spectrum is shown in FIG. 10, according to some embodiments.
Figure 10:
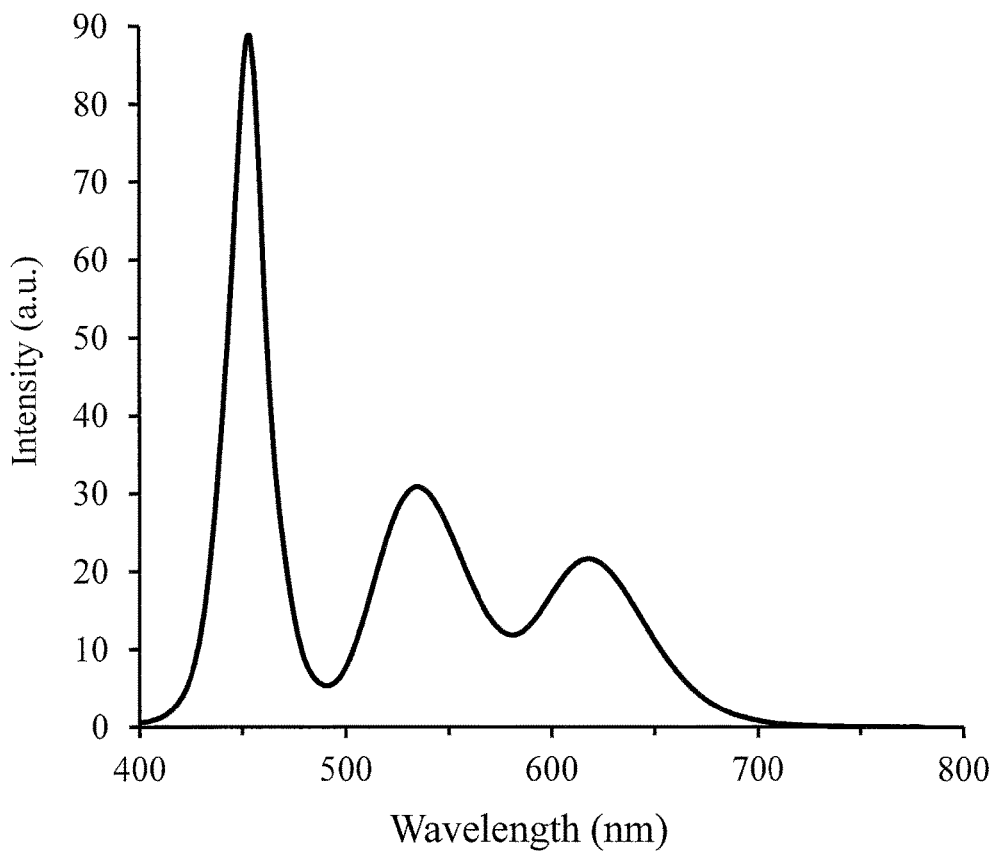
FIG. 10 shows a white light emission spectrum of a blue LED combined with a narrow band green $SrGa_2S_4$:Eu phosphor and a narrow band $CaS_{0.52}Se_{0.47}C_{0.01}Eu_{0.005}$ red phosphor suitable for display applications, according to some embodiments.

White LEDs using combined blue LED and YAG:Ce phosphor have been widely used as backlights for personal computer LCD screens, LCD TVs and small-sized LCDs used in devices such as cellular phones and tablet displays. To date, the color gamut of these LEDs can attain approximately 70% of the area of the NTSC standard, and the widest color gamut using a narrow-band β-SiAlON:Eu green and CaAlSiN$_3$:Eu red phosphors can reach ~85% of the area of the NTSC standard with the assistance of typical LCD color filters. Cd-based green and red quantum dots (QDs) have reached a wider color gamut—more than 115% of the area of the NTSC standard in the 1931 CIE xy color space; however, Cd-based QDs are toxic and environmentally harmful. The widest color gamut that Cd-free QDs, such as InP/ZnS QDs, can reach is approximately 87% relative to the NTSC standard. However, the combination of a red phosphor according to some embodiments of the present invention with various narrow band green phosphors, such as β-SiAlON:Eu or SrGa$_2$S$_4$:Eu, can reach approximately 94% of the area of the NTSC standard. See FIG. 9 which shows the 1931 CIE color coordinates of the NTSC standard (callout 910) and the calculated RGB coordinates from a white light source comprising a blue LED (451 nm) combined with the red phosphor of the present invention CaS$_{0.52}$Se$_{0.47}$C$_{0.01}$Eu$_{0.005}$ (peak emission at approximately 628 nm) and with the green phosphor SrGa$_2$S$_4$:Eu (535 nm) (callout 920). FIG. 10 shows the white light emission spectrum for the white light source for which the RGB coordinates were calculated and plotted in FIG. 9; the white light source of FIG. 10 is characterized by CIE (0.28, 0.26). Note that herein references to the percentage of the area of the NTSC standard are percentages of the area of the NTSC (National Television System Committee) 1953 color gamut specification as mapped on CIE 1931 xy chromaticity diagram.

It is expected that some embodiments of the narrow band red phosphors of the present invention when combined with one of the various possible narrow band green phosphors such as β-SiAlON:Eu, SrGa$_2$S$_4$:Eu or InP/ZnS green quantum dots are able to reach high efficiencies and high levels of color gamut for LED backlight applications, where the phosphors are integrated into "on-chip", "on-edge" or "on-film" LED backlights. Furthermore, it is expected that the performance of some embodiments of the narrow band red phosphors of the present invention in combination with one of the various possible narrow band green phosphors will provide higher efficiencies and higher levels of color gamut compared with red nitride phosphors such as (Ba,Sr)$_2$Si$_5$N$_8$:Eu$^{2+}$ or (Ca,Sr)AlSiN$_3$:Eu$^{2+}$ in combination with the same narrow band green phosphors.

Color LCD Display

Figure 11:
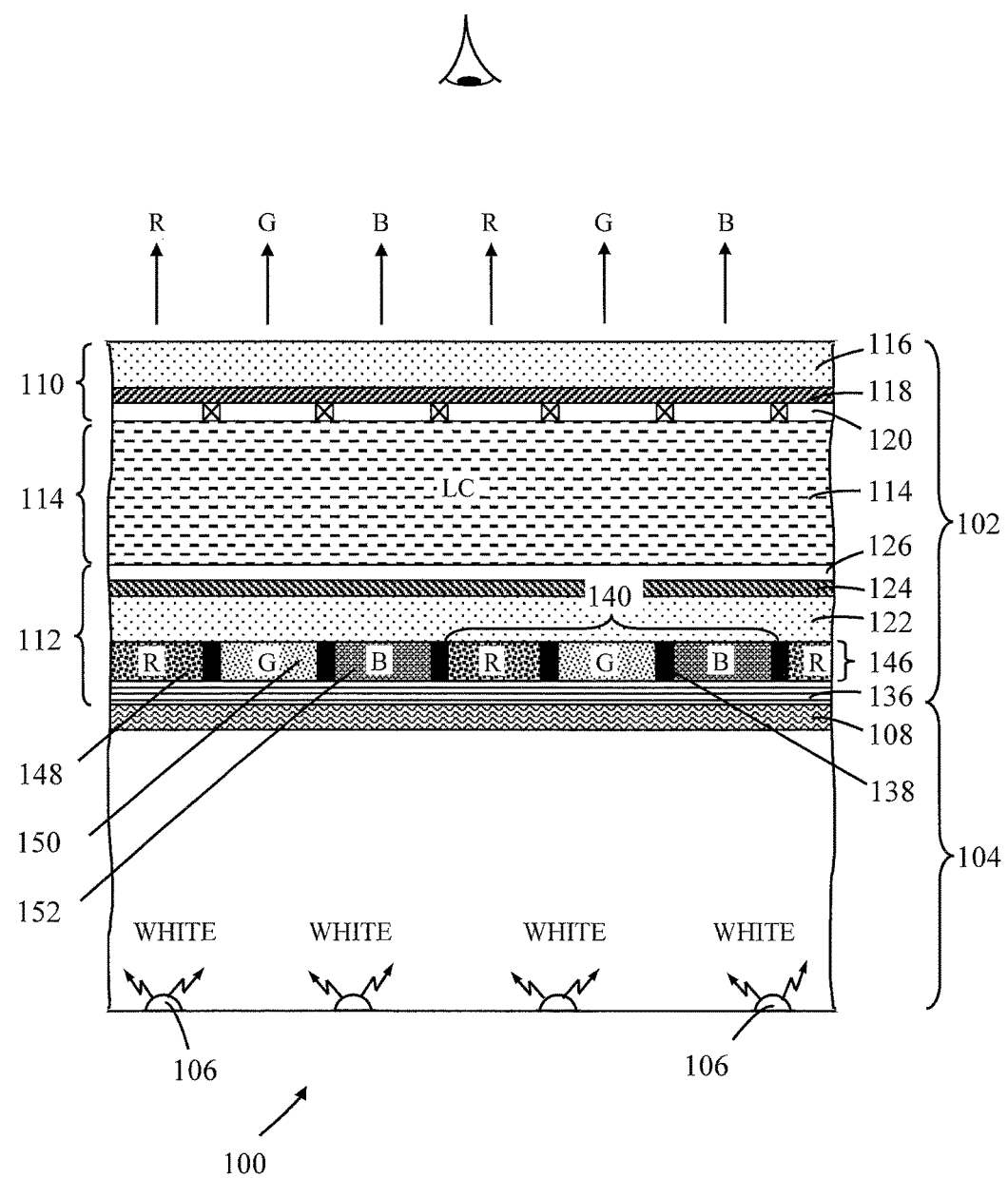
FIG. 11 is a schematic cross-sectional representation of a color liquid crystal display, according to some embodiments.

Referring to FIG. 11 there is shown a schematic cross-sectional representation of a color LCD 100 according to embodiments of the invention. The color LCD 100 comprises a display panel 102 and a backlighting unit 104.

The backlighting unit 104 comprises either a single white light source or a plurality of white light sources 106 and a light diffusing plane 108. Each white light source 106 is a white light display source such as described herein above, that is operable to emit white light with a specified chromaticity color gamut. The light diffusing plane 108 ensures the display panel 102 is substantially evenly irradiated with white light over its entire surface. The backlighting unit 104 may include an excitation source with peak emission in the blue part of the visible spectrum; a red-emitting such as a composition represented by the chemical formula MSxSeyAz:Eu, where M is at least one of Mg, Ca, Sr and Ba; A includes one or more of carbon, nitrogen, boron, phosphorous and a monovalent combining group NCN (cyanamide); $x \geq 0$; $y \geq 0.1$; $0 < z \leq 0.05$; and $0.8 < x+y < 1.25$; and a green-emitting phosphor having a peak emission in the green part of the visible spectrum.

The display panel 102 comprises a transparent (light transmissive) front (light/image emitting) plate 110, a transparent back plate 112 and a liquid crystal (LC) 114 filling the volume between the front and back plates. The front plate 110 comprises a glass plate 116 having on its underside, that is the face of the plate facing the LC 114, a first polarizing filter layer 118 and then a thin film transistor (TFT) layer 120. The back plate 112 comprises a glass plate 122 having a second polarizing filter layer 124 and a transparent common electrode plane 126 (for example transparent indium tin oxide, ITO) on its upper surface facing the LC and a color filter plate 146 on its underside facing the backlighting unit 104. Additionally, the back plate 112 can further comprise a wavelength selective filter 136 located between the color filter plate 146 and the backlighting unit 104. The function of the wavelength selective filter plate is described in further detail in U.S. Patent Appl. Pub. No. 2012/0287381, incorporated by reference in its entirety herein.

The TFT layer 120 comprises an array of TFTs, wherein there is a transistor corresponding to each individual color filter sub-pixel 148, 150, 152 of each pixel unit 140 of the color filter plate 146. Typically the directions of polarization of the two polarizing filters 118, 124 are aligned perpendicular to one another.

Figure 12:
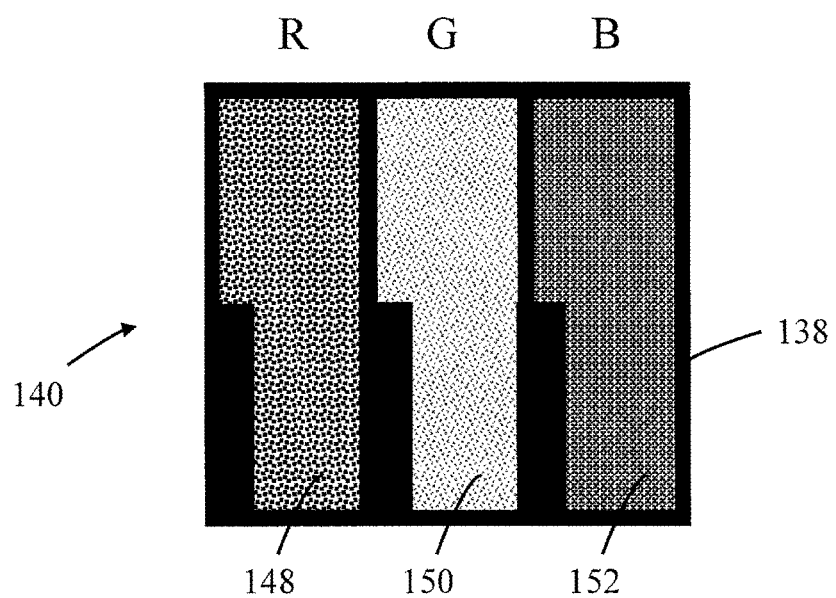
FIG. 12 is a schematic diagram of a unit pixel of a color filter plate of the display of FIG. 11.

The RGB color filters are packaged/configured on the color filter plate 146 as illustrated in FIG. 12 which shows a RGB unit pixel 140 of the color filter plate 146 comprising a sub-pixel triplet filled by three color filters 148, 150, 152. A grid mask (also termed a black matrix) 138 of metal, such as for example chromium, defines the color filter elements (sub-pixels) 148, 150, 152 and provides an opaque gap between the sub-pixels and unit pixels. Additionally the black matrix shields the TFTs from stray light and prevents cross-talk between neighboring sub-pixels/unit pixels. To minimize reflection from the black matrix 138, a double layer of Cr and CrOx may be used, but of course, the layers may comprise materials other than Cr and CrOx. The black matrix film which can be sputter-deposited underlying or overlying the photoluminescence material may be patterned using methods that include photolithography.

Figure 13:
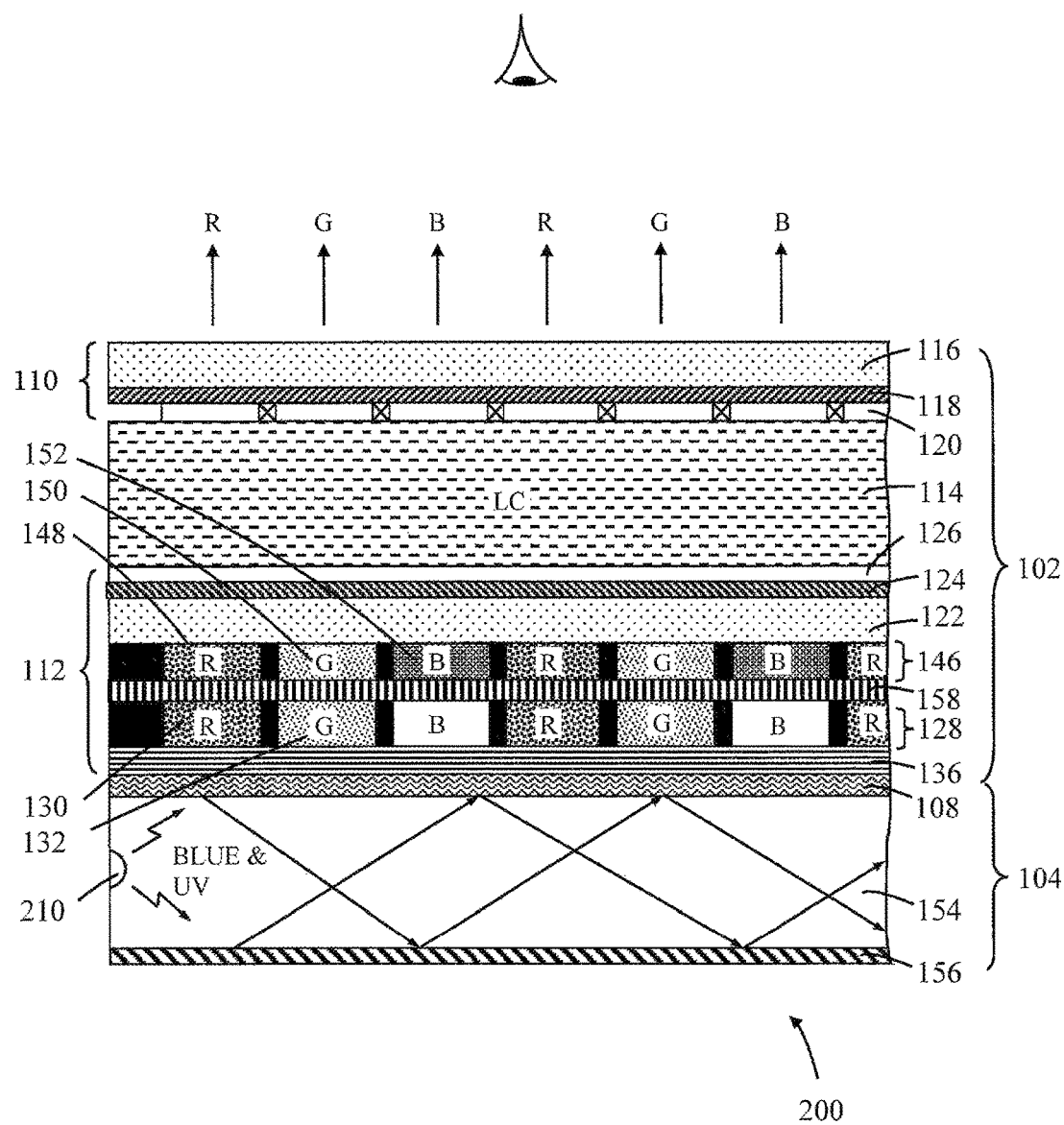
FIG. 13 is a schematic cross-sectional representation of a photoluminescence color LCD according to some further embodiments.
Figure 14:
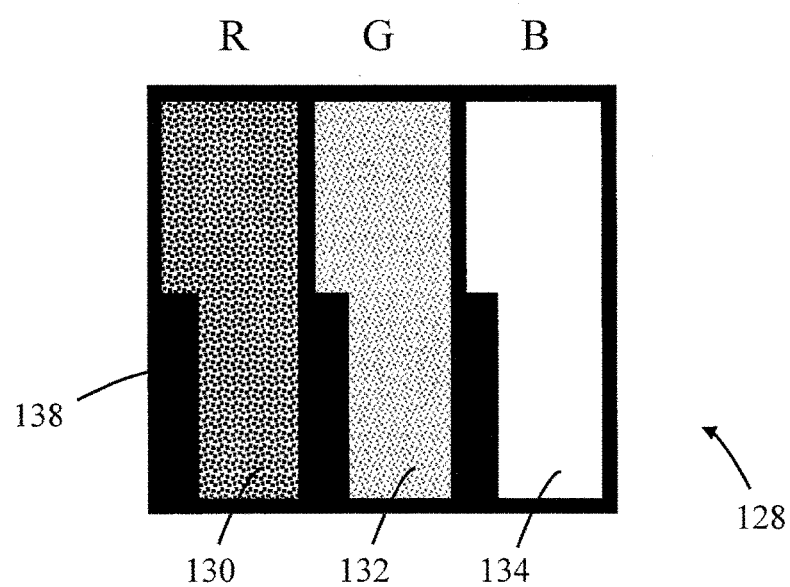
FIG. 14 is a schematic diagram of a unit pixel of a photoluminescent color-elements plate of the display of FIG. 13.

In a further embodiment, as illustrated in FIG. 13, there is shown a schematic cross-sectional representation of a color LCD 200 according to other embodiments of the invention. The color LCD 200 comprises a display panel 102 and a backlighting unit 104. Referring to FIGS. 13-14, the back plate 112 further includes a photoluminescence color-elements plate 128. The color-element plate 128 includes an array of red 130 and green 132 light emitting photoluminescence materials in which each color-element corresponds to a respective color sub-pixel in the display. As with the embodiment of FIG. 11 the display can further comprise a color filter plate 146 comprising an array of red 148, green 150 and blue 152 color filter elements in which each filter element corresponds to a respective color sub-pixel in the display. The color filter plate can be configured such that a red color filter element 148 is positioned overlaying a red photoluminescence color-element 130 in the color-element plate for displaying a red sub-pixel; a green color filter element 150 is positioned overlaying a green photoluminescence color-element 132 in the color-element plate for displaying a green sub-pixel; and a blue color filter element 152 is positioned overlaying a blue photoluminescence color-element 134 in the color-element plate for displaying a blue sub-pixel. Typically the blue color-element 134 does not include a photoluminescence material where the backlight comprises a blue excitation source. In other embodiments the color-elements plate may include a photoluminescence material corresponding to blue sub-pixels of the display. The function of the color filter plate 146 is to define the spectral band width of each sub-pixel and to prevent unconverted excitation radiation being emitted from pixel areas containing a photoluminescence material. The color filter plate 146 can comprise the color filter plate of a known display that uses a white backlight. Typically the various filter areas comprise a band pass filter with a pass band corresponding to the color of light emitted by each pixel area. Such filters not only prevent the transmission of unconverted excitation radiation but additionally can be used to narrow and/or fine tune the emission color of the pixel areas to optimize the performance of the display. The color filter plate includes at least one of first filter areas corresponding to red pixel areas of the display that are operable to allow the passage of red light second filter areas corresponding to green pixel areas of the display that are operable to allow the passage of green light and third filter areas corresponding to blue pixel areas of the display that are operable to allow the passage of blue light.

In the embodiment illustrated in FIG. 13 the backlighting unit 104 comprises a planar light guide (waveguide) 154 with one or more blue and UV co-excitation sources 210 located along one or more edges of the light guide 154. In operation excitation light is coupled into the edge(s) of the light guide and is guided, by total internal reflection, over the entire volume of the light guide to give a uniform illumination over the entire surface of the display panel. As shown and to prevent the escape of light from the backlight unit the rear of the light guide can further comprise a light reflective surface 156. The backlighting unit 104 may include an excitation source with peak emission in the blue part of the visible spectrum; a red-emitting such as a composition represented by the chemical formula MSxSeyAz:Eu, where M is at least one of Mg, Ca, Sr and Ba; A includes one or more of carbon, nitrogen, boron, phosphorous and a monovalent combining group NCN (cyanamide); $x \geq 0$; $y \geq 0.1$; $0 < z \leq 0.05$; and $0.8 < x+y < 1.25$; and a green-emitting phosphor having a peak emission in the green part of the visible spectrum.

The photoluminescence material elements in the photoluminescence color-elements plate 128 can absorb the excitation blue and UV light and emit light in colors corresponding to the display requirements. The color filter can improve the display by filtering out light in different colors, such as the backlight and/or incident light from other color elements.

Additionally, the back plate 112 can further comprise a wavelength selective filter 136 positioned between the photoluminescence color-elements plate 138 and the backlighting unit 210, and a Hoffman filter 158 that can guide the emitted light from photoluminescence color-element toward the color filter.

Referring also to FIG. 14, the photoluminescence color-elements plate 128 comprises an array of different photoluminescence color-elements (sub-pixels) 130, 132, 134 which emit red (R), green (G), and blue (B) light respectively in response to UV and/or blue excitation radiation from the backlighting unit 210. In some embodiments, only red 130 and green 132 photoluminescence materials are incorporated in the photoluminescence color-elements plate 128 since the blue excitation light may also serve as the third of the three primary colors that are essential for color rendering. The photoluminescence materials may be inorganic phosphors, such as described herein above, including (coated) red-emitting phosphors of the present invention, organic phosphors, and/or materials comprising quantum dots, all of which emit light of different colors, with a certain spectral width centered at a peak wavelength, when excited.

The RGB photoluminescence color-elements can be packaged/configured on the photoluminescence color-elements plate 138 to correspond with the color filters of the color filter plate 146. The arrangement of elements of the photoluminescence color-elements plate 128 is illustrated in FIG. 14 which shows a RGB unit pixel 140 of the photoluminescence color-elements plate 128 comprising a sub-pixel triplet filled by two photoluminescence color-elements 130, 132 with emissions centered at the primary red (R) and green (G) colors for UV and blue co-excited photoluminescence materials, such as phosphors and/or quantum dots. A grid mask (also termed a black matrix) 138 of metal, such as for example chromium, defines the photoluminescence color-elements (sub-pixels) 130, 132, 134 and provides an opaque gap between the photoluminescence sub-pixels and unit pixels. Additionally the black matrix shields the TFTs from stray light and prevents crosstalk between neighboring sub-pixels/unit pixels. To minimize reflection from the black matrix 138, a double layer of Cr and CrOx may be used, but of course, the layers may comprise materials other than Cr and CrOx. The black matrix film which can be sputter-deposited underlying or overlying the photoluminescence material may be patterned using methods that include photolithography. As described above, in some embodiments, only red 130 and green 132 photoluminescence materials are incorporated in the photoluminescence color-elements plate 128 since the blue excitation light may also serve as the third of the three primary colors that are essential for color rendering.

Fabrication of a color display of the present invention as described above with reference to FIGS. 11-14, are based on processes well known to those skilled in the art of LCD display fabrication. The photoluminescence color-elements plate 128 may be fabricated using a combination of lithography and deposition techniques known to those skilled in the art of display fabrication.

Although the present invention has been described with reference to phosphors for display applications, in embodiments the phosphors of the present invention may be used in high CRI (color rendering index) white light applications when used in combination with a broad band red emitting phosphor such as $Eu^{2+}$ or $Ce^{3+}$ doped (oxy)nitride compounds, for example $(Ba,Sr)_2Si_5N_8:Eu^{2+}$ and $(Ca,Sr)AlSiN_3:Eu^{2+}$.

Although the present invention has been particularly described with reference to phosphor compounds in which M is one or more alkaline earth metals, in embodiments some amount of other metals such as zinc, lithium or cadmium may substitute for some of the alkaline earth metal.

Although the present invention has been particularly described with reference to certain embodiments thereof, it should be readily apparent to those of ordinary skill in the art that changes and modifications in the form and details may be made without departing from the spirit and scope of the invention.

What is claimed is:

1. A red-emitting phosphor, comprising:
   phosphor particles with a composition represented by the chemical formula $MS_xSe_yA_z$:Eu, wherein
   M is at least one of Mg, Ca, Sr and Ba;
   A comprises one or more of carbon, nitrogen, boron, phosphorous and a monovalent combining group NCN (cyanamide);
   $x \geq 0$;
   $y \geq 0.1$;
   $0 < z \leq 0.05$; and
   $0.8 < x+y < 1.25$.

2. The red-emitting phosphor of claim 1, wherein x+y is not equal to 1.

3. The red-emitting phosphor of claim 1, wherein $1.0 < x+y < 1.25$.

4. The red-emitting phosphor of claim 1, wherein x, y and z have values which provide a charge balanced chemical formula.

5. The red-emitting phosphor of claim 1, further comprising one or more of oxygen, fluorine, chlorine, bromine and iodine.

6. The red-emitting phosphor of claim 1, wherein M is calcium.

7. The red-emitting phosphor of claim 1, wherein M is strontium.

8. The red-emitting phosphor of claim 1, wherein A is carbon.

9. The red-emitting phosphor of claim 1, wherein A is boron.

10. The red-emitting phosphor of claim 1, wherein $0 < z < 0.03$.

11. The red-emitting phosphor of claim 1, further comprising a coating on individual ones of said phosphor particles, said coating comprising one or more materials chosen from the group consisting of aluminum oxide, silicon oxide, titanium oxide, zinc oxide, magnesium oxide, zirconium oxide, boron oxide, chromium oxide, calcium fluoride, magnesium fluoride, zinc fluoride, aluminum fluoride and titanium fluoride.

12. The red-emitting phosphor of claim 1, wherein said coating comprises aluminum oxide.

13. The red-emitting phosphor of claim 1, wherein said phosphor particles have a particle size distribution defined by diameter, $D_{50}$, being in the range of 3 to 45 microns.

14. The red-emitting phosphor of claim 1, wherein said phosphor particles have a particle size distribution defined by diameter, $D_{50}$, being in the range of 5 to 25 microns.

15. A white light emitting device, comprising:
   at least one of a blue and UV excitation source;
   a red-emitting phosphor as in claim 1; and
   a green or yellow-emitting phosphor having a peak emission wavelength in the range from about 515 nm to about 570 nm.

16. The white light source of claim 15, wherein said excitation source has a peak emission wavelength within a range from 200 nm to 480 nm.

17. The white light source of claim 15, wherein said excitation source has a peak emission wavelength within a range from 400 nm to 480 nm.

18. The white light source of claim 15, wherein said excitation source has a peak emission wavelength within a range from 450 nm to 480 nm.

19. The white light source of claim 15, wherein said red-emitting phosphor particles absorb radiation at a wavelength of 450 nm and emit light with a photoluminescence peak emission wavelength between about 600 nm and about 630 nm.

20. The white light source of claim 15, wherein said red-emitting phosphor has an emission peak full width half maximum of less than 55 nm.

21. A display backlight, comprising:
an excitation source with peak emission in the blue part of the visible spectrum;
a red-emitting phosphor as in claim 1; and
a green-emitting phosphor having a peak emission in the green part of the visible spectrum.

22. The display backlight of claim 21, wherein the white light illumination emitted by the display backlight covers an area including greater than 90% of NTSC 1953 color gamut specification as mapped on CIE 1931 xy chromaticity diagram.

23. A liquid crystal color display comprising:
a display panel comprising a plurality of red, green and blue pixel areas;
a display backlight as in claim 21; and
a color filter plate located on a side of the display panel that is distal to the white light illumination system, wherein the color filter plate comprises at least one of:
first filter areas corresponding to red pixel areas of the display that are operable to allow the passage of red light;
second filter areas corresponding to green pixel areas of the display that are operable to allow the passage of green light; and
third filter areas corresponding to blue pixel areas of the display that are operable to allow the passage of blue light.

24. A photoluminescence color display comprising:
a display panel comprising a plurality of red, green and blue pixel areas;
an excitation source operable to generate excitation radiation for operating the display;
a photoluminescence color-elements plate comprising at least one of:
a first photoluminescence material corresponding to red pixel areas of the display that is operable to emit red light in response to said excitation radiation, said first photoluminescence material comprising a red-emitting phosphor as in claim 1;
a second photoluminescence material corresponding to green pixel areas of the display that is operable to emit green light in response to said excitation radiation; and
a third photoluminescence material corresponding to blue pixel areas of the display that is operable to emit blue light in response to said excitation radiation; and
a color filter plate located on a side of the display panel that is distal to the excitation source, wherein the color filter plate comprises at least one of:
first filter areas corresponding to red pixel areas of the display that are operable to allow the passage of red light;
second filter areas corresponding to green pixel areas of the display that are operable to allow the passage of green light; and
third filter areas corresponding to blue pixel areas of the display that are operable to allow the passage of blue light.

25. A method of making a phosphor, comprising:
combining in a crucible $MSeO_4$:Eu crystals, powdered sulphur and powdered material comprising A; and
sintering the combined materials;
grinding the sintered material; and
washing the ground material;
wherein M is at least one of Mg, Ca, Sr and Ba;
wherein A comprises one or more of carbon, nitrogen, boron, phosphorous and the monovalent combining group NCN(cyanamide);
wherein the amount of S is chosen to provide a desired stoichiometric ratio of Se to S; wherein the amount of A is between 2.0 and 5.5 wt. %; and
wherein said phosphor has a composition represented by the chemical formula $MS_xSe_yA_z$:Eu, wherein $0<z\le0.5$, $x\ge0$, $y\ge0.1$, and $0.8<x+y<1.25$.

26. The method as in claim 25, further comprising adding a flux material in said combining, wherein said flux material is chosen from the group consisting of LiF, $NH_4Cl$, $CaCl_2$) and $NH_4Br$.

27. The method as in claim 25, wherein said material comprising A is carbon.

28. The method as in claim 25, wherein said material comprising A is boric acid.

29. The method as in claim 25, wherein A is between 3.0 and 4.5 wt. %.

30. The method as in claim 25, wherein A is between 3.3 and 4.3 wt. %.

* * * * *